(12) United States Patent
Tung et al.

(10) Patent No.: US 11,361,701 B1
(45) Date of Patent: Jun. 14, 2022

(54) DRIVING CIRCUIT AND DRIVING METHOD

(71) Applicant: AU Optronics Corporation, Hsin-Chu (TW)

(72) Inventors: Che-Wei Tung, Hsin-Chu (TW); Shang-Jie Wu, Hsin-Chu (TW); Yu-Chieh Kuo, Hsin-Chu (TW); Yu-Hsun Chiu, Hsin-Chu (TW); Che-Chia Chang, Hsin-Chu (TW); Yu-Zuo Lin, Hsin-Chu (TW); Chen-Ying Chou, Hsin-Chu (TW); Yi-Fan Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 17/511,157

(22) Filed: Oct. 26, 2021

Related U.S. Application Data

(60) Provisional application No. 63/155,483, filed on Mar. 2, 2021.

(30) Foreign Application Priority Data

Sep. 8, 2021 (TW) .................. 110133443

(51) Int. Cl.
*G09G 3/20* (2006.01)
*H03K 5/156* (2006.01)
*H03K 17/687* (2006.01)

(52) U.S. Cl.
CPC ......... *G09G 3/2074* (2013.01); *H03K 5/1565* (2013.01); *H03K 17/6871* (2013.01); *G09G 2300/0443* (2013.01); *G09G 2300/0809* (2013.01); *G09G 2310/0297* (2013.01);
(Continued)

(58) Field of Classification Search
None
See application file for complete search history.

(56) References Cited

U.S. PATENT DOCUMENTS

| 11,100,849 | B1 * | 8/2021 | Yang | .................... G09G 3/32 |
| 2019/0371231 | A1 * | 12/2019 | Kim | .................... G09G 3/2081 |
| 2019/0371232 | A1 * | 12/2019 | Kim | .................... H01L 27/156 |

(Continued)

FOREIGN PATENT DOCUMENTS

| CN | 101707046 A | 5/2010 |
| TW | I740653 B | 9/2021 |

*Primary Examiner* — Christopher J Kohlman
(74) *Attorney, Agent, or Firm* — WPAT, PC

(57) ABSTRACT

The present disclosure relates to a driving circuit including a pulse amplitude modulation (PAM) circuit and a pulse width modulation (PWM) circuit. The PAM circuit includes a first transistor, a first capacitor, and a second transistor. The PWM circuit includes a second capacitor, a third transistor, and a fourth transistor. The first capacitor's first terminal is connected to the first transistor's gate. The second transistor's first terminal is connected to the first capacitor's first terminal, and the second transistor's second terminal is connected to the first transistor's second terminal. The third transistor's gate is connected to the second capacitor's second terminal. The fourth transistor's first terminal is connected to the third transistor's gate, the fourth transistor's second terminal is connected to the third transistor's second terminal, and the fourth transistor's gate is connected to the second transistor's gate and configured to receive a first control signal.

20 Claims, 15 Drawing Sheets

(52) U.S. Cl.
  CPC ... *G09G 2310/061* (2013.01); *G09G 2310/08* (2013.01); *G09G 2320/0233* (2013.01)

(56) References Cited

U.S. PATENT DOCUMENTS

| | | | |
|---|---|---|---|
| 2020/0111403 A1* | 4/2020 | Kim | G09G 3/32 |
| 2020/0265777 A1* | 8/2020 | Shigeta | G09G 3/2014 |
| 2020/0312216 A1* | 10/2020 | Kim | G09G 3/2014 |
| 2020/0394953 A1* | 12/2020 | Kim | H05B 45/33 |
| 2022/0101783 A1* | 3/2022 | Han | G09G 3/32 |

* cited by examiner

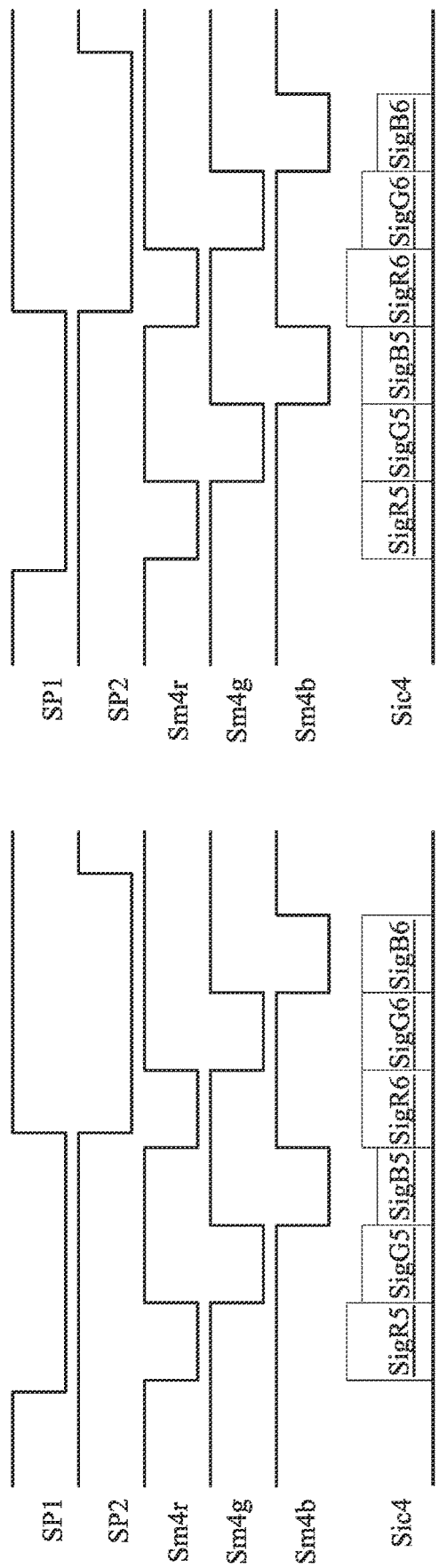

DRIVING CIRCUIT AND DRIVING METHOD

CROSS-REFERENCE TO RELATED APPLICATION

This application claims priority to U.S. Provisional Application Ser. No. 63/155,483, filed Mar. 2, 2021, and Taiwan Application Serial Number 110133443, filed Sep. 8, 2021, which are herein incorporated by reference in their entireties.

BACKGROUND

Field of Invention

The present invention relates to a driving circuit and a driving method. More particularly, the present invention relates to a driving circuit and a driving method which include a pulse amplitude modulation circuit and a pulse width modulation circuit.

Description of Related Art

In a display, thin-film transistors (TFTs) located at different positions will receive driving signals with different delay, and thus there will be non-uniformity in the brightness of the display. Specifically, when the gray level is low, the brightness uniformity may drop to below 80%. Because the driving signals received by TFTs located at different positions cannot be cut off at the same time, other solution is needed to solve the brightness non-uniformity issue.

SUMMARY

The invention provides a driving circuit, including a pulse amplitude modulation circuit and a pulse width modulation circuit. The pulse amplitude modulation circuit is configured to control a strength of a driving signal. The pulse amplitude modulation circuit includes a first transistor, a first capacitor, and a second transistor. The first capacitor's first terminal is electrically connected to the first transistor's gate terminal. The second transistor's first terminal is electrically connected to the first capacitor's first terminal, and its second terminal is electrically connected to the first transistor's second terminal. The pulse width modulation circuit is configured to control a lasting time of the driving signal. The pulse width modulation circuit includes a second capacitor, a third transistor, and a fourth transistor. The third transistor's gate terminal is electrically connected to the second capacitor's second terminal. The fourth transistor's first terminal is electrically connected to the third transistor's gate terminal, its second terminal is electrically connected to the third transistor's second terminal, and its gate terminal is electrically connected to the second transistor's gate terminal and configured to receive a first control signal.

The invention also provides a driving method configured to drive a pixel circuit. The driving method includes: in a first mode, adjusting a voltage of a pulse width modulation voltage feed-in end of the pixel circuit and fixing a voltage of a pulse amplitude modulation voltage feed-in end of the pixel circuit; and in a second mode, fixing the voltage of the pulse width modulation voltage feed-in end, and adjusting the voltage of the pulse amplitude modulation voltage feed-in end. The voltage of the pulse width modulation voltage feed-in end controls a lasting time of a driving signal, and the voltage of the pulse amplitude modulation voltage feed-in end controls a strength of the driving signal.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 6C is a timing diagram of control signals of the driving circuit in FIG. 6A in a first mode according to one embodiment of the present disclosure.

FIG. 6D is a timing diagram of control signals of the driving circuit in FIG. 6A in a second mode according to one embodiment of the present disclosure.

DETAILED DESCRIPTION

Figure 1:
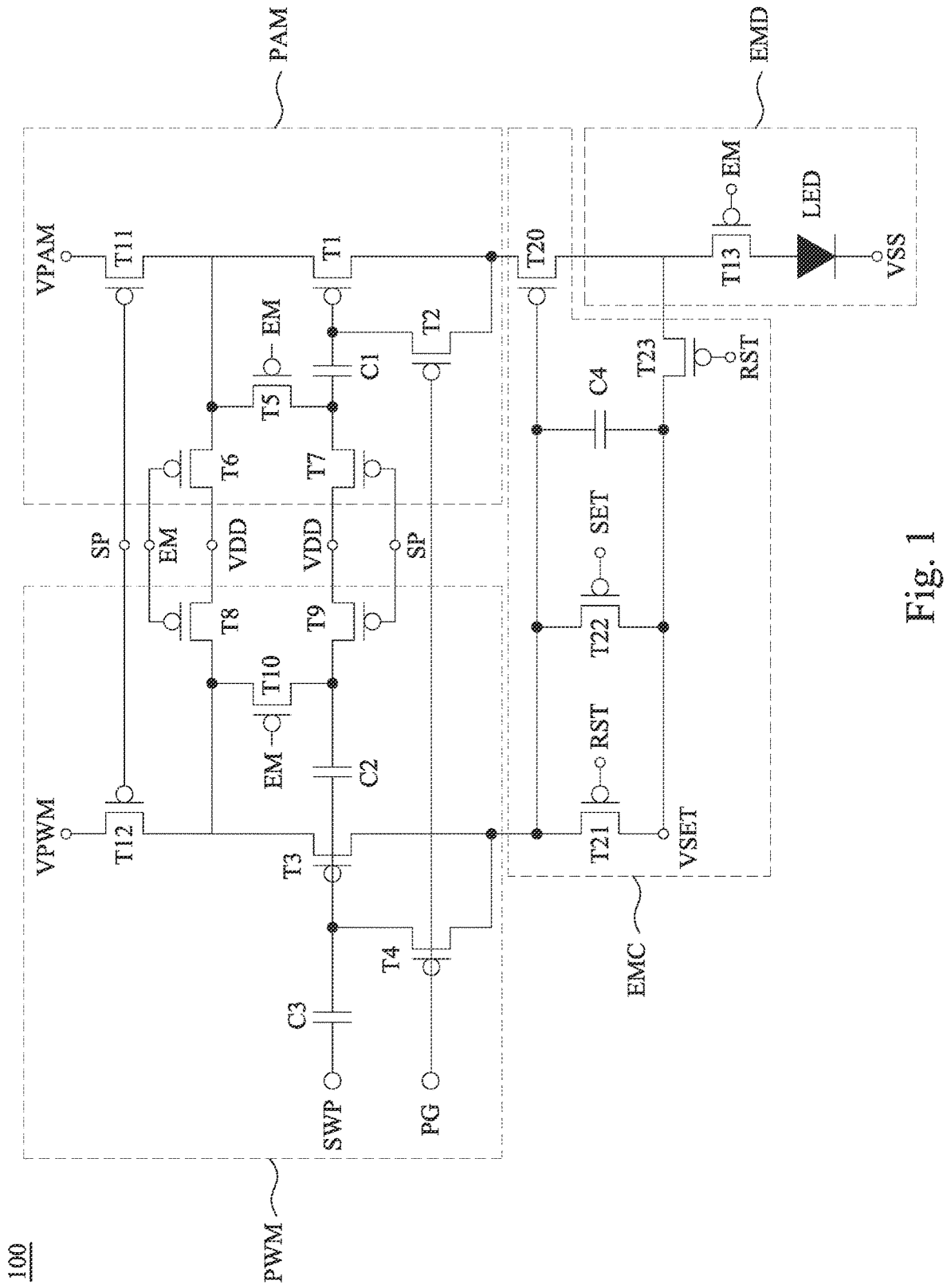
FIG. 1 is a circuit diagram of a driving circuit according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items.

It will be understood that when an element is referred to as being "connected to," "coupled to," or "electrically connected to" another element, it can be directly connected or coupled to the other element or intervening elements may be present. In contrast, when an element is referred to as being "directly connected to," "directly coupled to," or "directly electrically connected to" another element, there is no intervening element present. In addition, when an element is referred to as being "communicatively connected to" another element, it can be indirectly or directly connected to the other element through wire or wireless communication. Moreover, it will be understood that, although the terms "first," "second," etc., may be used herein to describe various elements, these elements should not be limited by these terms. These terms are used to distinguish one element from another.

The present disclosure discloses a driving circuit. Please refer to FIG. 1. FIG. 1 is a circuit diagram of a driving circuit 100 according to one embodiment of the present disclosure. The driving circuit 100 includes a pulse amplitude modulation circuit PAM and a pulse width modulation circuit PWM. The pulse amplitude modulation circuit PAM is configured to control a strength of a driving signal, and the pulse width modulation circuit PWM is configured to control a lasting time of the driving signal. The driving signal is configured to drive a light emitting diode. In one embodiment, the driving signal is configured to drive a micro light emitting diode. The pulse amplitude modulation circuit PAM includes a first transistor T1, a first capacitor C1, and a second transistor T2. As shown in FIG. 1, the gate terminal of the first transistor T1, the first terminal of the first capacitor C1, and the first terminal of the second transistor T2 are electrically connected together, and the second terminal of the second transistor T2 is electrically connected to the second terminal of the first transistor T1. The pulse width modulation circuit PWM includes a second capacitor C2, a third transistor T3, and a fourth transistor T4. As shown in FIG. 1, the gate terminal of the third transistor T3, the second terminal of the second capacitor C2, and the first terminal of the fourth transistor T4 are electrically connected together, the second terminal of the fourth transistor T4 is electrically connected to the second terminal of the third transistor T3, and the gate terminal of the fourth transistor T4 is electrically connected to the gate terminal of the second transistor T2 and is configured to receive a first control signal PG.

In one embodiment, the pulse amplitude modulation circuit PAM further includes a fifth transistor T5, a sixth transistor T6, and a seventh transistor T7, and the pulse width modulation circuit PWM further includes an eighth transistor T8, a ninth transistor T9, and a tenth transistor T10. As shown in FIG. 1, the first terminal of the fifth transistor T5, the first terminal of the first transistor T1, and the first terminal of the sixth transistor T6 are electrically connected together, the gate terminal of the fifth transistor T5 is configured to receive a light emitting signal EM, the second terminal of the fifth transistor T5, the second terminal of the first capacitor C1, and the first terminal of the seventh transistor T7 are electrically connected together, the gate terminal of the sixth transistor T6 is configured to receive the light emitting signal EM, the second terminal of the sixth transistor T6 is electrically connected to a first system voltage terminal VDD, the second terminal of the seventh transistor T7 is electrically connected to the first system voltage terminal VDD, the first terminal of the eighth transistor T8 is electrically connected to the first system voltage terminal VDD, the gate terminal of the eighth transistor T8 is configured to receive the light emitting signal EM, the second terminal of the eighth transistor T8, the first terminal of the tenth transistor T10, and the first terminal of the third transistor T3 are electrically connected together, the gate terminal of the tenth transistor T10 is configured to receive the light emitting signal EM, the second terminal of the tenth transistor T10, the second terminal of the ninth transistor T9, and the first terminal of the second capacitor C2 are electrically connected together, and the first terminal of the ninth transistor T9 is electrically connected to the first system voltage terminal VDD.

In one embodiment, the pulse amplitude modulation circuit PAM further includes an eleventh transistor T11, and the pulse width modulation circuit PWM further includes a twelfth transistor T12 and a third capacitor C3. As shown in FIG. 1, the first terminal of the eleventh transistor T11 is electrically connected to a pulse amplitude modulation voltage feed-in end VPAM, the second terminal of the eleventh transistor T11, the first terminal of the first transistor T1, the first terminal of the fifth transistor T5, and the first terminal of the sixth transistor T6 are electrically connected together, the first terminal of the twelfth transistor T12 is electrically connected to a pulse width modulation voltage feed-in end VPWM, the second terminal of the twelfth transistor T12, the second terminal of the eighth transistor T8, the first terminal of the tenth transistor T10, and the first terminal of the third transistor T3 are electrically connected together, the first terminal of the third capacitor C3, the second terminal of the second capacitor C2, the gate terminal of the third transistor T3, and the first terminal of the fourth transistor T4 are electrically connected together, and the second terminal of the third capacitor C3 is configured to receive a second control signal SWP.

In one embodiment, as shown in FIG. 1, the gate terminals of the seventh transistor T7, the ninth transistor T9, the eleventh transistor T11, and the twelfth transistor T12 are all configured to receive a third control signal SP.

In one embodiment, the driving circuit 100 further includes a light emitting control circuit EMC and a light emitting device EMD. The light emitting device EMD includes a thirteenth transistor T13 and a light emitting diode LED. As shown in FIG. 1, the light emitting control circuit EMC is electrically connected to the pulse amplitude modulation circuit PAM and the pulse width modulation circuit PWM, the first terminal of the thirteenth transistor T13 is electrically connected to the light emitting control circuit EMC, the gate terminal of thirteenth transistor T13 is configured to receive a light emitting signal EM, the anode of the light emitting diode LED is electrically connected to the second terminal of the thirteenth transistor T13, and the cathode of the light emitting diode LED is electrically connected to a second system voltage terminal VSS. In one embodiment, the pulse amplitude modulation circuit PAM is configured to control the amount of current that passes through the light emitting diode LED, and the pulse width modulation circuit PWM is configured to control the time when the current is allowed to pass through and thus turn on the light emitting diode LED.

In one embodiment, the light emitting control circuit EMC further includes a twentieth transistor T20, a twenty-first transistor T21, a twenty-second transistor T22, a twenty-third transistor T23, and a fourth capacitor C4. As shown in FIG. 1, the first terminal of the twentieth transistor T20, the second terminal of the first transistor T1, and the second terminal of the second transistor T2 are electrically connected together, the gate terminal of the twentieth transistor T20, the second terminal of the third transistor T3, the second terminal of the fourth transistor T4, the first terminal of the twenty-first transistor T21, the first terminal of the twenty-second transistor T22, and the first terminal of the fourth capacitor C4 are electrically connected together, the second terminal of the twentieth transistor T20, the first terminal of the thirteenth transistor T13, and the first terminal of the twenty-third transistor T23 are electrically connected together, the gate terminal of the twenty-first transistor T21 is configured to receive a reset signal RST, the second terminal of the twenty-first transistor T21 is electrically connected to a third system voltage terminal VSET, the gate terminal of the twenty-second transistor T22 is configured to receive a setting signal SET, the second terminal of the twenty-second transistor T22 is electrically connected to the third system voltage terminal VSET, the second terminal of the twenty-second transistor T22, the second terminal of the fourth capacitor C4, and the second terminal of the twenty-third transistor T23 are electrically connected together, and the gate terminal of the twenty-third transistor T23 is configured to receive the reset signal RST.

In one embodiment, each transistor used in the driving circuit 100 is a p-type transistor of which the current path between its source terminal and drain terminal conducts when its gate terminal is subjected to a low voltage level or a low logic level.

Figure 2:
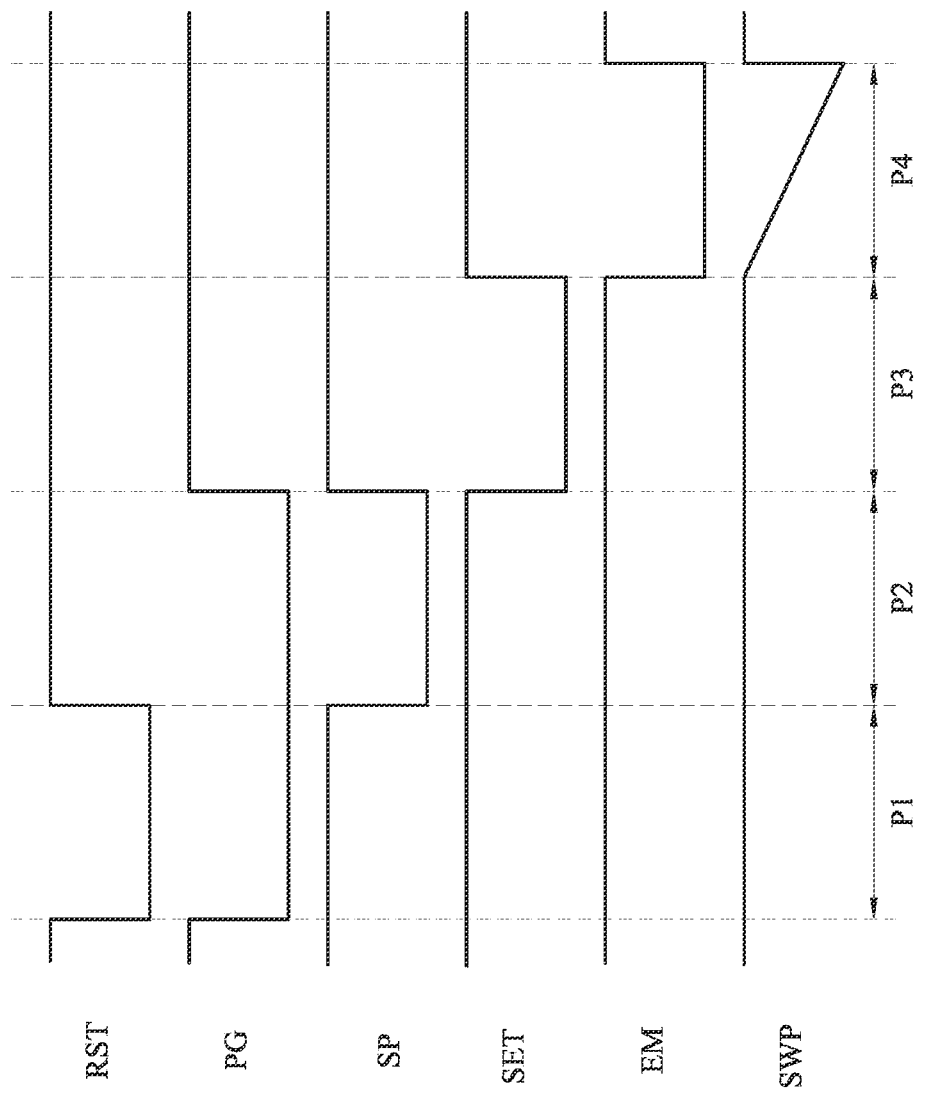
FIG. 2 is a timing diagram of control signals of the driving circuit in FIG. 1 according to one embodiment of the present disclosure.

In one embodiment, the driving circuit 100 sequentially operates in a reset period P1, a data writing period P2, a current conducting period P3, and a light emitting period P4. Please refer to FIG. 2. FIG. 2 is a timing diagram of control signals of the driving circuit 100 in FIG. 1 according to one embodiment of the present disclosure. During the reset period P1, the reset signal RST has a low logic level, the first control signal PG has a low logic level, the third control signal SP has a high logic level, the setting signal SET has a high logic level, the light emitting signal EM has a high logic level, and the second control signal SWP has a high logic level.

Figure 3A:
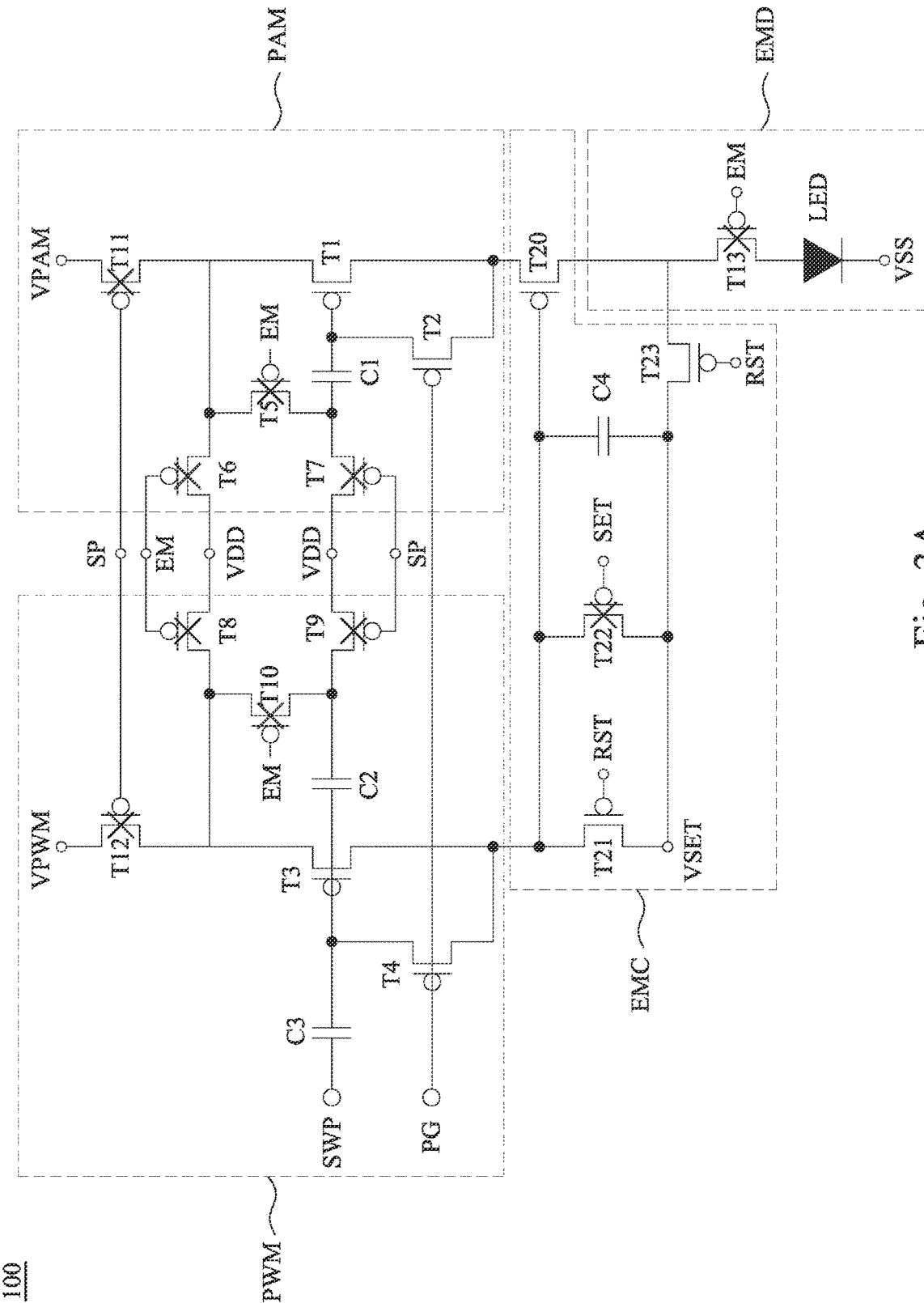
FIG. 3A is a circuit state diagram of the driving circuit in FIG. 1 during a reset period according to one embodiment of the present disclosure.

Please refer to FIG. 3A. FIG. 3A is a circuit state diagram of the driving circuit 100 in FIG. 1 during the reset period P1 according to one embodiment of the present disclosure. During the reset period P1, according to the described logic levels of the reset signal RST, the first control signal PG, the third control signal SP, the setting signal SET, the light emitting signal EM, and the second control signal SWP, the eleventh transistor T11, the twelfth transistor T12, the sixth transistor T6, the eighth transistor T8, the fifth transistor T5, the tenth transistor T10, the seventh transistor T7, the ninth transistor T9, the thirteenth transistor T13, and the twenty-second transistor T22 do not conduct, and the fourth transistor T4, the twenty-first transistor T21, the second transistor T2, the twentieth transistor T20, and the twenty-third transistor T23 conduct.

During the reset period P1, the voltage level of the third system voltage terminal VSET is transmitted to the gate terminal of the third transistor T3 through the twenty-first transistor T21 and the fourth transistor T4, so that the gate terminal of the third transistor T3 has a voltage level substantially equal to the voltage level of the third system voltage terminal VSET. In addition, the voltage level of the third system voltage terminal VSET is transmitted to the gate terminal of the first transistor T1 through the twenty-third transistor T23, the twentieth transistor T20, and the second transistor T2, so that the gate terminal of the first transistor T1 has a voltage level substantially equal to the voltage level of the third system voltage terminal VSET. Therefore, during the reset period P1, the driving circuit 100 resets the voltage levels of the gate terminals of the third transistor T3 and the first transistor T1 to be substantially equal to the voltage level of the third system voltage terminal VSET, in order to perform subsequent light emitting operations of the driving circuit 100. In one embodiment, the third system voltage terminal VSET has a low voltage level.

Please refer to FIG. 2 again. During the data writing period P2, the reset signal RST, the setting signal SET, the light emitting signal EM, and the second control signal SWP have high logic levels, and the first control signal PG and the third control signal SP have low logic levels.

Figure 3B:
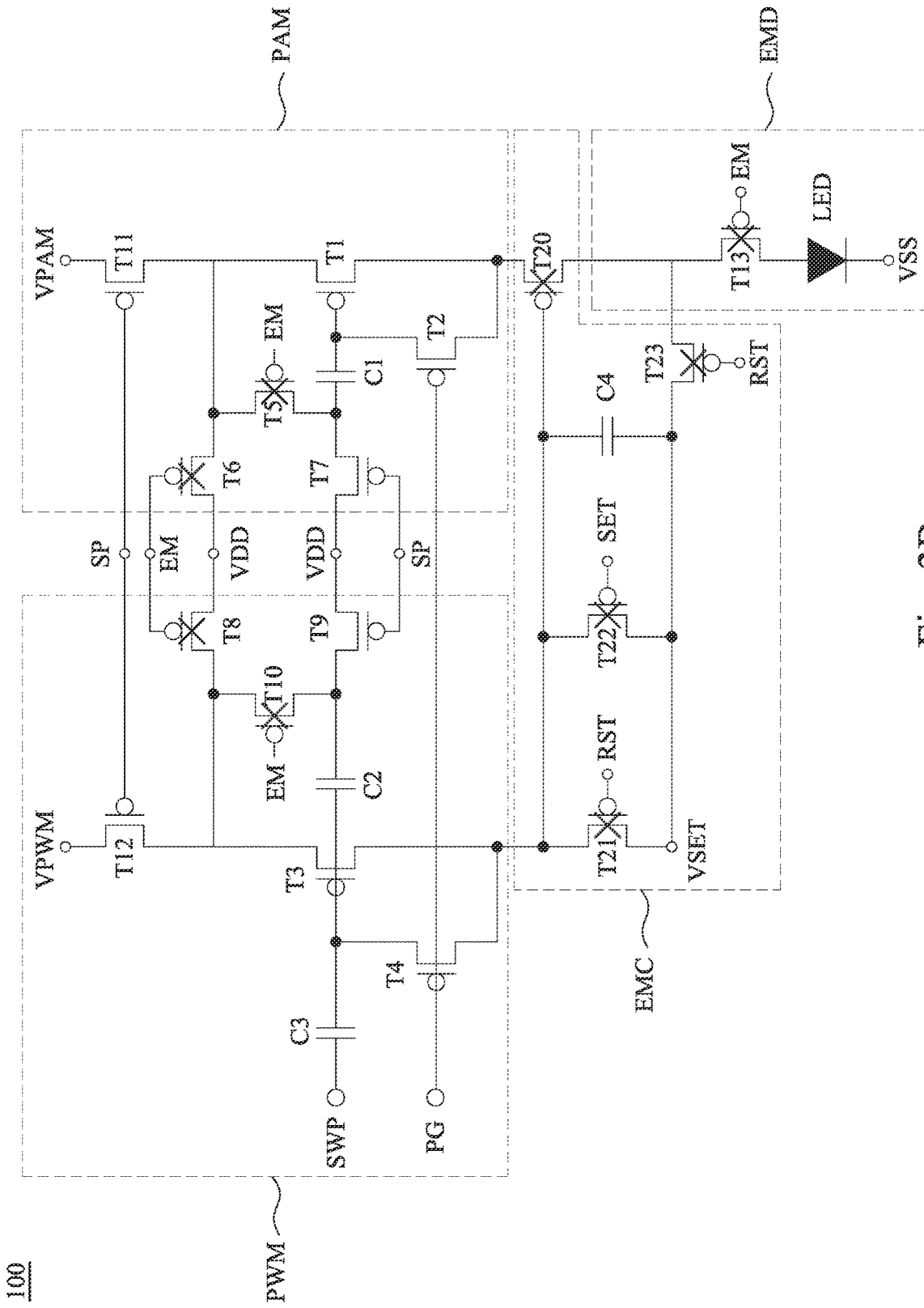
FIG. 3B is a circuit state diagram of the driving circuit in FIG. 1 during a data writing period according to one embodiment of the present disclosure.

Please then refer to FIG. 3B. FIG. 3B is a circuit state diagram of the driving circuit 100 in FIG. 1 during the data writing period P2 according to one embodiment of the present disclosure. During the data writing period P2, according to the described logic levels of the reset signal RST, the first control signal PG, the third control signal SP, the setting signal SET, the light emitting signal EM, and the second control signal SWP, the sixth transistor T6, the eighth transistor T8, the fifth transistor T5, the tenth transistor T10, the twentieth transistor T20, the twenty-first transistor T21, the twenty-second transistor T22, the twenty-third transistor T23, and the thirteenth transistor T13 do not conduct, and the seventh transistor T7, the ninth transistor T9, the twelfth transistor T12, the third transistor T3, the fourth transistor T4, the eleventh transistor T11, the first transistor T1, and the second transistor T2 conduct.

During the data writing period P2, the voltage level of the first system voltage terminal VDD is transmitted to the second terminal of the first capacitor C1 through the seventh transistor T7 and to the first terminal of the second capacitor C2 through the ninth transistor T9, so that the second terminal of the first capacitor C1 and first terminal of the second capacitor C2 have voltage levels substantially equal to the voltage level of the first system voltage terminal VDD. Meanwhile, the voltage level of the pulse amplitude modulation voltage feed-in end VPAM is transmitted to the gate terminal of the first transistor T1 (and also to the first terminal of the first capacitor C1) through the eleventh transistor T11, the first transistor T1, and the second transistor T2, so that the gate terminal of the first transistor T1 has a voltage level substantially equal to the voltage level of the pulse amplitude modulation voltage feed-in end VPAM. Meanwhile, the voltage level of the pulse width modulation voltage feed-in end VPWM is transmitted to the gate terminal of the third transistor T3 (and also to the second terminal of the second capacitor C2) through the twelfth transistor T12, the third transistor T3, and the fourth transistor T4, so that the gate terminal of the third transistor T3 has a voltage level substantially equal to the voltage level of the pulse width modulation voltage feed-in end VPWM.

Please refer to FIG. 2 again. During the current conducting period P3, the reset signal RST, the first control signal PG, the third control signal SP, the light emitting signal EM, and the second control signal SWP have high logic levels, and the setting signal SET has a low logic level.

Figure 3C:
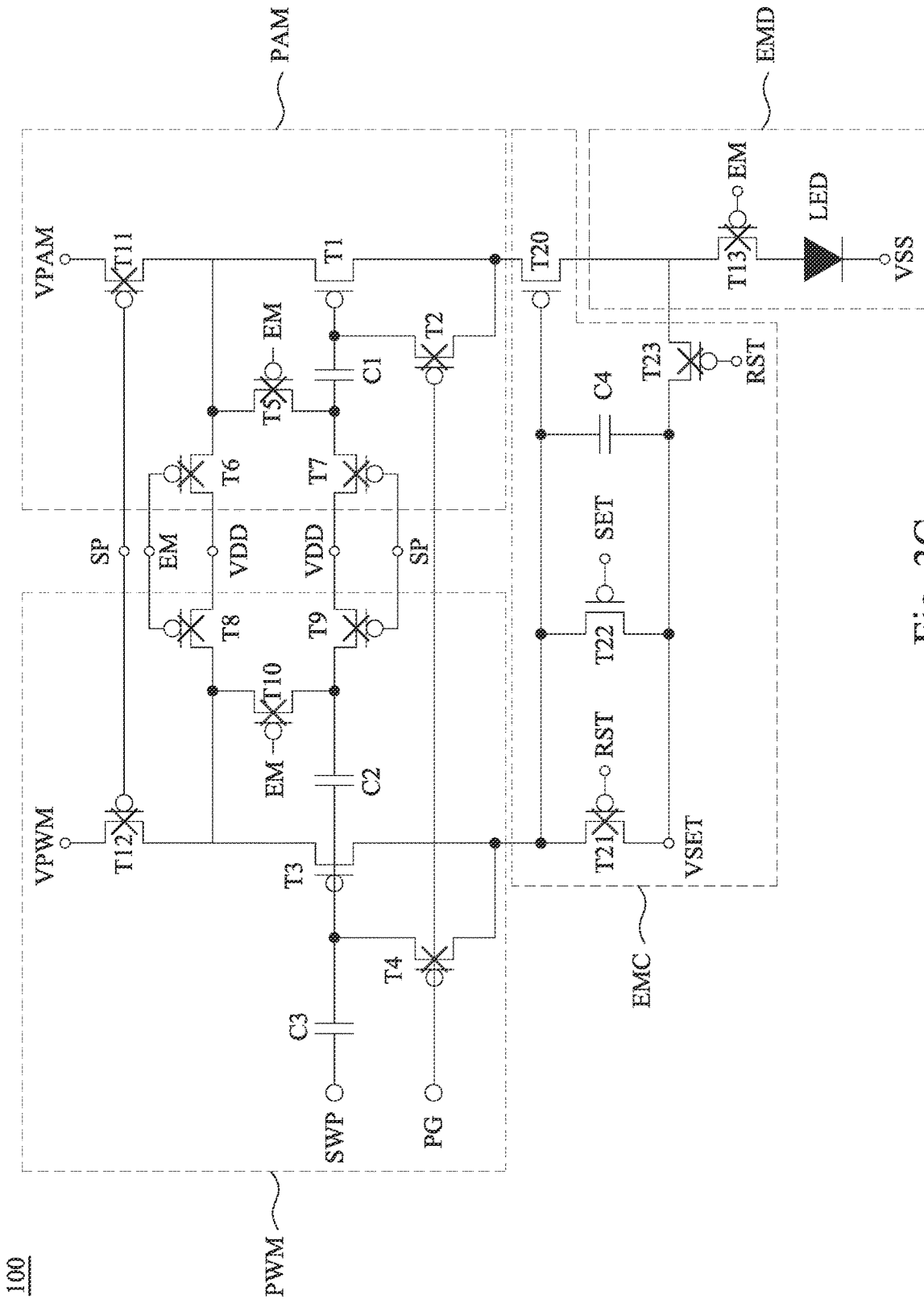
FIG. 3C is a circuit state diagram of the driving circuit in FIG. 1 during a current conducting period according to one embodiment of the present disclosure.

Please then refer to FIG. 3C. FIG. 3C is a circuit state diagram of the driving circuit 100 in FIG. 1 during the current conducting period P3 according to one embodiment of the present disclosure. During the current conducting period P3, according to the described logic levels of the reset signal RST, the first control signal PG, the third control signal SP, the setting signal SET, the light emitting signal EM, and the second control signal SWP, the eleventh transistor T11, the twelfth transistor T12, the sixth transistor T6, the eighth transistor T8, the fifth transistor T5, the tenth transistor T10, the seventh transistor T7, the ninth transistor T9, the second transistor T2, the fourth transistor T4, the twenty-first transistor T21, the twenty-third transistor T23, and the thirteenth transistor T13 do not conduct, and the twenty-second transistor T22 conducts.

During the current conducting period P3, the voltage level of the third system voltage terminal VSET is transmitted to the gate terminal of the twentieth transistor T20 through the twenty-second transistor T22, so that the gate terminal of the twentieth transistor T20 has a voltage level substantially equal to the voltage level of the third system voltage terminal VSET. Therefore, during the current conducting period P3, the gate terminal of the twentieth transistor T20 has a low voltage level, and thus the twentieth transistor T20 conducts.

Please refer to FIG. 2 again. During the light emitting period P4, the reset signal RST, the first control signal PG, the third control signal SP, the setting signal SET have high logic levels, the light emitting signal EM have a low logic level, and the second control signal SWP have a logic level that starts with a high level and then declines to a low level. In one embodiment, the second control signal SWP has a shape of a triangle wave.

Figure 3D:
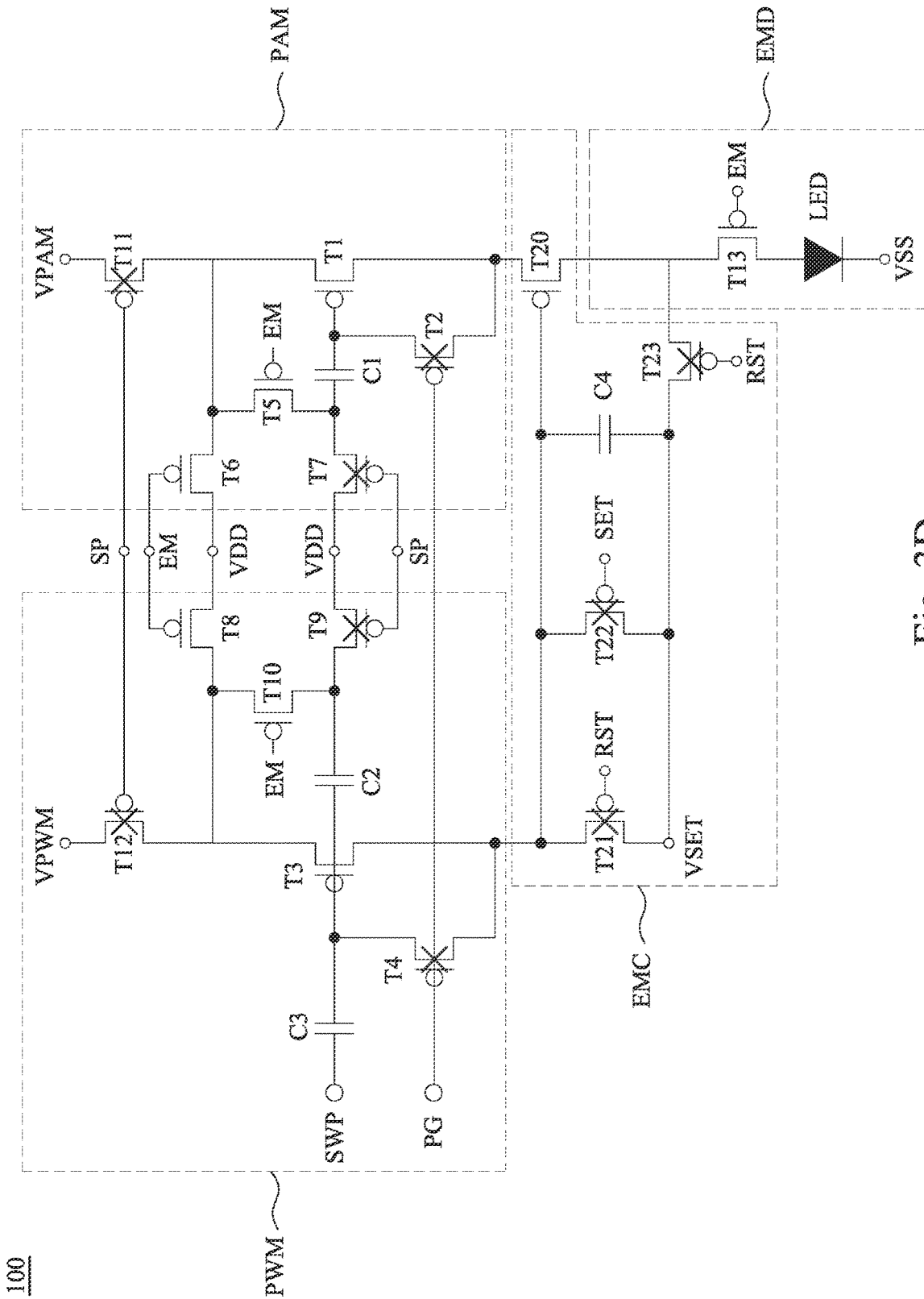
FIG. 3D is a circuit state diagram of the driving circuit in FIG. 1 during a light emitting period according to one embodiment of the present disclosure.

Please then refer to FIG. 3D. FIG. 3D is a circuit state diagram of the driving circuit 100 in FIG. 1 during the light emitting period P4 according to one embodiment of the present disclosure. During the light emitting period P4, according to the described logic levels of the reset signal RST, the first control signal PG, the third control signal SP, the setting signal SET, the light emitting signal EM, and the second control signal SWP, the eleventh transistor T11, the twelfth transistor T12, the seventh transistor T7, the ninth transistor T9, the second transistor T2, the fourth transistor T4, the twenty-first transistor T21, the twenty-second transistor T22, and the twenty-third transistor T23 do not conduct, and the sixth transistor T6, the first transistor T1, the twentieth transistor T20, the thirteenth transistor T13, the eighth transistor T8, the third transistor T3, the fifth transistor T5, and the tenth transistor T10 conduct.

During the light emitting period P4, the voltage level of the first system voltage terminal VDD is transmitted to the anode of the light emitting diode LED through the sixth transistor T6, the first transistor T1, the twentieth transistor T20, and the thirteenth transistor T13, in order to generate the driving signal to drive the light emitting diode LED to emit light. At the beginning of the light emitting period P4, the second control signal SWP has a high logic level, and the third transistor T3 do not conduct. Yet, during the light emitting period P4, because the third capacitor C3 is electrically connected to the gate terminal of the third transistor T3, when the logic level of the second control signal SWP becomes lower, the voltage level of the gate terminal of the third transistor T3 becomes lower as well. When the voltage level of the gate terminal of the third transistor T3 is lower than a certain level, the third transistor T3 will conduct, and the voltage level of the first system voltage terminal VDD will be transmitted to the gate terminal of the twentieth transistor T20 through the eighth transistor T8 and the third transistor T3. When the voltage level of the gate terminal of the twentieth transistor T20 becomes higher than a certain level, the twentieth transistor T20 will not conduct, and the light emitting diode LED will no longer emit light. This mechanism is how the pulse width modulation circuit PWM cuts off the current which the pulse amplitude modulation circuit PAM provides to drive the light emitting diode LED.

In addition, during the light emitting period P4, when the current passes through the light emitting diode LED, the driving circuit 100 will have large voltage drop (IR drop). Such IR drop can be compensated by coupling the first capacitor C1 to the gate terminal of the first transistor T1 and coupling the second capacitor C2 to the gate terminal of the third transistor T3. Specifically, the voltage level of the first system voltage terminal VDD is transmitted to the second terminal of the first capacitor C1 through the sixth transistor T6 and the fifth transistor T5, so the voltage difference between the first and second terminals of the first capacitor C1 can be maintained to be the same as the voltage difference between the first and second terminals of the first capacitor C1 during the data writing period P2, and the voltage difference between the gate terminal and drain terminal (VGD) of the first transistor T1 will not be affected by the IR drop. The voltage level of the first system voltage terminal VDD is transmitted to the first terminal of the second capacitor C2 through the eighth transistor T8 and the tenth transistor T10, so the voltage difference between the first and second terminals of the second capacitor C2 can be maintained to be the same as the voltage difference between the first and second terminals of the second capacitor C2 during the data writing period P2, and the voltage difference between the gate terminal and drain terminal of the third transistor T3 will not be affected by the IR drop. Therefore, the first capacitor C1 can stabilize the voltage level of the gate terminal of the first transistor T1, the second capacitor C2 can stabilize the voltage level of the gate terminal of the third transistor T3, and thus the IR drop of the driving circuit 100 can be compensated.

In conclusion, through the circuit configuration and signal transmission described above, the driving circuit 100 can stabilize voltage level and prevent the driving circuit 100 from being affected by voltage drop.

In one embodiment, the driving circuit 100 has two driving modes and determines which mode to use according to different gray levels. The driving modes include a first mode and a second mode. In one embodiment, in a 8-bit grayscale, when the gray level is greater than or equals to the eleventh level (L11), the driving circuit 100 uses the first mode to drive the light emitting diode LED; when the gray level is smaller than the eleventh level, the driving circuit 100 uses the second mode to drive the light emitting diode LED. It should be noted that the eleventh level in this embodiment does not intend to limit the present disclosure, and person having ordinary skills in the art can adjust the condition under which the driving circuit should be switched to the different driving mode according to real needs and/or the design of display.

Following the embodiment described above, in the first mode, the voltage of the pulse width modulation voltage feed-in end VPWM is adjustable, and the voltage of the pulse amplitude modulation voltage feed-in end VPAM is fixed. In the second mode, the voltage of the pulse width modulation voltage feed-in end VPWM is fixed, the voltage of the pulse amplitude modulation voltage feed-in end VPAM is adjustable. In other words, in the first mode, the pulse width modulation circuit PWM uses the adjustable voltage of the pulse width modulation voltage feed-in end VPWM to control the lasting time of the driving signal (i.e. to control when to turn off the light emitting diode LED), and the pulse amplitude modulation circuit PAM uses the fixed voltage of the pulse amplitude modulation voltage feed-in end VPAM to control the strength of the driving signal (i.e. to control the driving current of the light emitting diode LED). When gray level is small and the driving circuit 100 is switched to the second driving mode, the pulse width modulation circuit PWM uses the fixed voltage of the pulse width modulation voltage feed-in end VPWM to control the lasting time of the driving signal, the pulse amplitude modulation circuit PAM uses the adjustable voltage of the pulse amplitude modulation voltage feed-in end VPAM to control the strength of the driving signal.

In one embodiment, in the second mode, the fixed voltage of the pulse width modulation voltage feed-in end VPWM is used to prolong the light emitting time, and the adjustable voltage of the pulse amplitude modulation voltage feed-in end VPAM is used to lower the current passing through the light emitting diode LED. By this way, when the driving circuit 100 drives multiple light emitting diodes LED in a display, the signal delay due to the different positions of the light emitting diodes LED will have lower impact on the uniformity of the display's brightness.

Figure 4A:
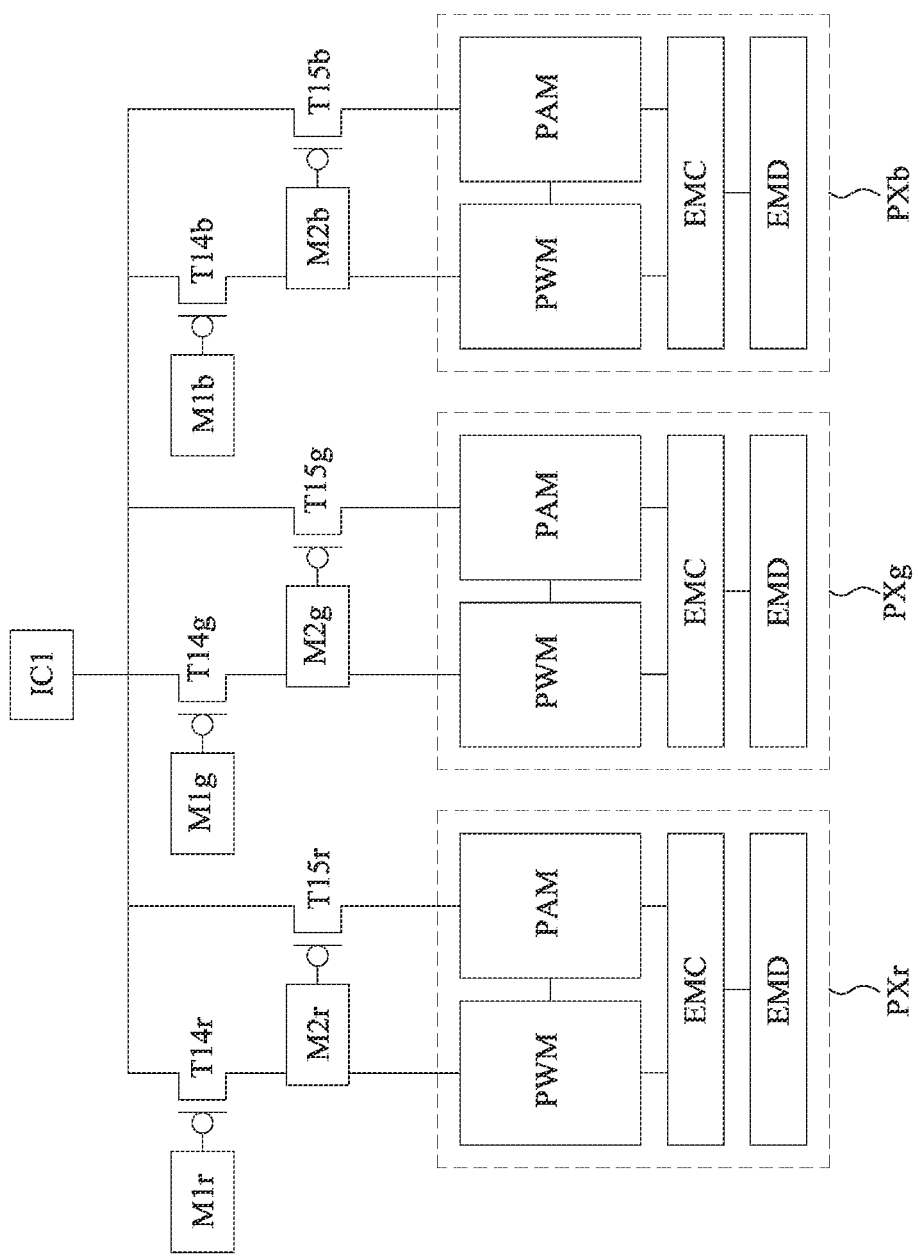
FIG. 4A is a circuit diagram of a driving circuit according to one embodiment of the present disclosure.

The following paragraphs describe the circuit configuration and signal transmissions that allow the driving circuit 100 to switch between the first mode and the second mode. Please refer to FIG. 4A. FIG. 4A is a circuit diagram of a driving circuit 400 according to one embodiment of the present disclosure. In one embodiment, the driving circuit 400 includes sub-pixel driving circuits PXr, PXg, PXb, which correspond to the red, green, and blue sub-pixels of a display. The driving circuit 400 also includes the fourteenth transistors T14r, T14g, T14b, the first multiplexers M1r, M1g, M1b, the fifteenth transistors T15r, T15g, T15b, and the second multiplexers M2r, M2g, M2b. The fourteenth transistor T14r, the first multiplexer M1r, the fifteenth transistor T15r, and the second multiplexer M2r correspond to the sub-pixel driving circuit PXr, the fourteenth transistor T14g, the first multiplexer M1g, the fifteenth transistor T15g, and the second multiplexer M2g correspond to the sub-pixel driving circuit PXg, and the fourteenth transistor T14b, the first multiplexer M1b, the fifteenth transistor T15b, and the second multiplexer M2b correspond to the sub-pixel driving circuit PXb.

Please refer to both FIG. 1 and FIG. 4A. Following the previous embodiment, the sub-pixel driving circuits PXr, PXg, PXb of the driving circuit 400 have the same circuit configuration as the driving circuit 100 in the embodiment shown in FIG. 1, and each of them has the pulse width modulation circuit PWM, the pulse amplitude modulation circuit PAM, the light emitting control circuit EMC, and the light emitting device EMD, with the same components (i.e., transistors, capacitors, light emitting diodes, etc.) and connections.

Please refer to both FIG. 1 and FIG. 4A. Following the previous embodiment, the voltages of the pulse width modulation voltage feed-in end VPWM and the pulse amplitude modulation voltage feed-in end VPAM of the sub-pixel driving circuit PXr are provided by a first integrated circuit IC1. The circuit configuration between the sub-pixel driving circuit PXr and the first integrated circuit IC1 of the driving circuit 400 is described below. The first terminal of the fourteenth transistor T14r is electrically connected to the first integrated circuit IC1, and the second terminal of the fourteenth transistor T14r is electrically connected to the pulse width modulation voltage feed-in end VPWM of the pulse width modulation circuit PWM; the first multiplexer M1r is electrically connected to the gate terminal of the fourteenth transistor T14r and configured to determine when the fourteenth transistor T14r conducts; the first terminal of the fifteenth transistor T15r is electrically connected to the first integrated circuit IC1, and the second terminal of the fifteenth transistor T15r is electrically connected to the pulse amplitude modulation voltage feed-in end VPAM of the pulse amplitude modulation circuit PAM; the second multiplexer M2r is electrically connected to the gate terminal of the fifteenth transistor T15r and configured to control the time when the fifteenth transistor T15r conducts.

As shown in FIG. 4A, the circuit configuration between the sub-pixel driving circuit PXg and the first integrated circuit IC1 is similar to the circuit configuration between the sub-pixel driving circuit PXr and the first integrated circuit IC1 described above. In other words, the pulse width modulation circuit PWM of the sub-pixel driving circuit PXg is electrically connected to the first integrated circuit IC1 through the fourteenth transistor T14g, the pulse amplitude modulation circuit PAM of the sub-pixel driving circuit PXg is electrically connected to the first integrated circuit IC1 through the fifteenth transistor T15g, the first multiplexer M1g is electrically connected to the gate terminal of the fourteenth transistor T14g, and the second multiplexer M2g is electrically connected to the gate terminal of the fifteenth transistor T15g. Likewise, the circuit configuration between the sub-pixel driving circuit PXb and the first integrated circuit IC1 is similar to the circuit configuration between the sub-pixel driving circuit PXr/PXg and the first integrated circuit ICE In one embodiment, as shown in FIG. 4A, the first terminals of the fourteenth transistors T14r, T14g, T14b, and the first terminals of the fifteenth transistors T15r, T15g, T15b are electrically connected together.

Below describe the control signals that the driving circuit 400 receives in the first mode. Please refer to FIG. 4A and FIG. 4B. FIG. 4B is a timing diagram of control signals of the driving circuit 400 in FIG. 4A in the first mode according to one embodiment of the present disclosure. In one embodiment, the first integrated circuit IC1 is configured to transmit signal Sic1 to the sub-pixel driving circuits PXr, PXg, PXb, and the signal Sic1 includes signals SigR1, SigG1, SigB1, SigR2, SigG2, SigB2. The first multiplexer M1r is configured to transmit the control signal Sm1r to the gate terminal of the fourteenth transistor T14r, the first multiplexer M1g is configured to transmit the control signal Sm1g to the gate terminal of the fourteenth transistor T14g, the first multiplexer M1b is configured to transmit the control signal Sm1b to the gate terminal of the fourteenth transistor T14b, the second multiplexer M2r is configured to transmit the control signal Sm2r to the gate terminal of the fifteenth transistor T15r, the second multiplexer M2g is configured to transmit the control signal Sm2g to the gate terminal of the fifteenth transistor T15g, and the second multiplexer M2b is configured to transmit the control signal Sm2b to the gate terminal of the fifteenth transistor T15b.

As shown in FIG. 4B, in this embodiment, when the third control signal SP has a low logic level (i.e., when the sub-pixel driving circuits PXr, PXg, PXb operate during the data writing period P2 as the embodiment shown in FIG. 3B), the first integrated circuit IC1 transmits the signal Sic1 to the sub-pixel driving circuits PXr, PXg, PXb in order to write the signals SigR1, SigG1, SigB1, SigR2, SigG2, SigB2 into the third transistor T3 and the first transistor T1 in the sub-pixel driving circuits PXr, PXg, PXb (please refer to FIG. 3B).

Specifically, as shown in FIG. 4B, the first integrated circuit IC1 first outputs the signal SigR1, and at this time, the control signal Sm1r is the only signal having a low logic level, other than the third control signal SP. Thus, the first multiplexer M1r transmits the control signal Sm1r to the gate terminal of the fourteenth transistor T14r, the fourteenth transistor T14r conducts, and the signal SigR1 is transmitted to the pulse width modulation circuit PWM of the sub-pixel driving circuit PXr.

Then, the first integrated circuit IC1 outputs the signal SigG1, and at this time, the control signal Sm1g is the only signal having a low logic level, other than the third control signal SP. Thus, the first multiplexer M1g transmits the control signal Sm1g to the gate terminal of the fourteenth transistor T14g, the fourteenth transistor T14g conducts, and the signal SigG1 is transmitted to the pulse width modulation circuit PWM of the sub-pixel driving circuit PXg. Similarly, the first integrated circuit IC1 outputs the signal SigB1, and the signal SigB1 is transmitted to the pulse width modulation circuit PWM of the sub-pixel driving circuit PXb.

After outputting signal SigB1, the first integrated circuit IC1 outputs signals SigR2, SigG2, SigB2 sequentially. These signals are respectively transmitted to the pulse amplitude modulation circuits PAM of the sub-pixel driving circuits PXr, PXg, PXb. First, the first integrated circuit IC1 outputs the signal SigR2, and the second multiplexer M2r transmits the control signal Sm2r to the gate terminal of the fifteenth transistor T15r, so that the fifteenth transistor T15r conducts and the signal SigR2 is transmitted to the pulse amplitude modulation circuit PAM of the sub-pixel driving circuit PXr. Then, the first integrated circuit IC1 outputs the signal SigG2, and the second multiplexer M2g transmits the control signal Sm2g to the gate terminal of the fifteenth transistor T15g, so that the fifteenth transistor T15g conducts and the signal SigG2 is transmitted to the pulse amplitude modulation circuit PAM of the sub-pixel driving circuit PXg. Lastly, the first integrated circuit IC1 outputs the signal SigB2, and the second multiplexer M2b transmits the control signal Sm2b to the gate terminal of the fifteenth transistor T15b, so that the fifteenth transistor T15b conducts and the signal SigB2 is transmitted to the pulse amplitude modulation circuit PAM of the sub-pixel driving circuit PXb.

It is worth noted that, because in the first mode the voltage of the pulse width modulation voltage feed-in end VPWM is adjustable and the voltage of the pulse amplitude modulation voltage feed-in end VPAM is fixed, the signals SigR1, SigG1, SigB1 transmitted to the pulse width modulation circuit PWM of the sub-pixel driving circuits PXr, PXg, PXb may have different strengths (as shown in FIG. 4B). On the other hand, the signals SigR2, SigG2, SigB2 transmitted to the pulse amplitude modulation circuit PAM of the sub-pixel driving circuits PXr, PXg, PXb will have the same fixed strength (as shown in FIG. 4B). It should be noted that, the relative strengths of the signals SigR1, SigG1, SigB1, SigR2, SigG2, SigB2 do not intend to limit the present disclosure and are used merely as examples, illustrating that the signals SigR1, SigG1, SigB1 can have adjustable strengths, and that the signals SigR2, SigG2, SigB2 will have the same and fixed strength.

Figure 4C:
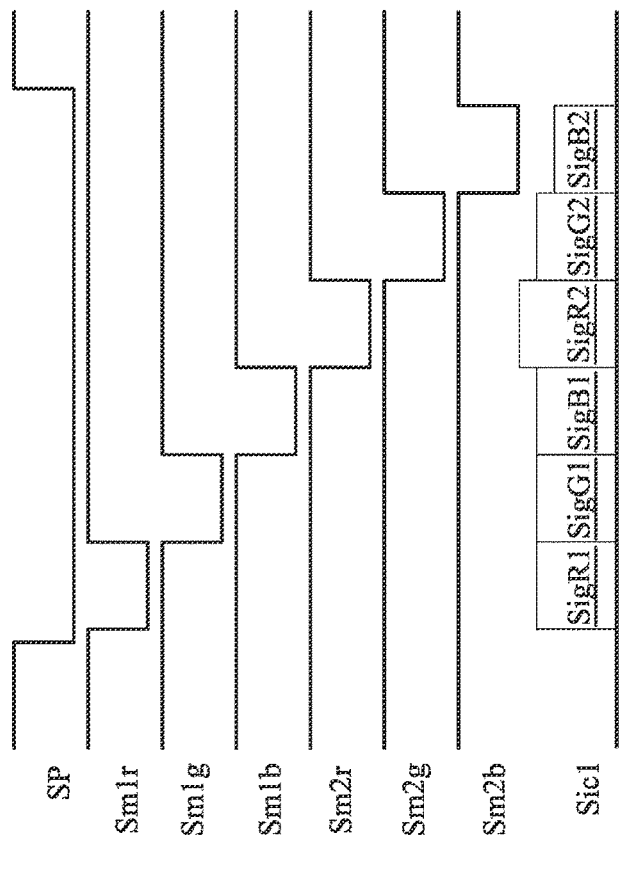
FIG. 4C is a timing diagram of control signals of the driving circuit in FIG. 4A in a second mode according to one embodiment of the present disclosure.
Figure 4B:
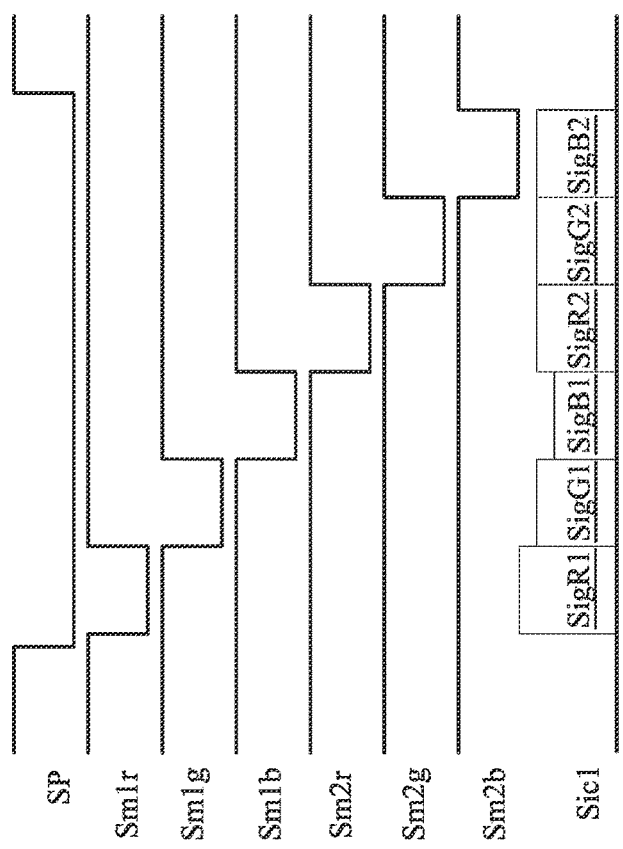
FIG. 4B is a timing diagram of control signals of the driving circuit in FIG. 4A in a first mode according to one embodiment of the present disclosure.

As to the control signals of the driving circuit 400 in the second mode, please refer to FIG. 4A and FIG. 4C. FIG. 4C is a timing diagram of control signals of the driving circuit 400 in FIG. 4A in the second mode according to one embodiment of the present disclosure. In the embodiment of FIG. 4C, the control signals Sm1r, Sm1g, Sm1b, Sm2r, Sm2g, Sm2b have low logic levels at different time periods, and the first integrated circuit IC1 outputs the corresponding signals SigR1, SigG1, SigB1, SigR2, SigG2, SigB2 at those time periods. For example, the first integrated circuit IC1 first outputs the signal SigR1, and at this time, the control signal Sm1r is the only signal having a low logic level, other than the third control signal SP. Thus, the fourteenth transistor T14r conducts, and the signal SigR1 is transmitted to the pulse width modulation circuit PWM of the sub-pixel driving circuit PXr. The transmissions of other signals (i.e., signals SigG1, SigB1, SigR2, SigG2, SigB2) in the second mode can refer to the previous description.

It is worth noted that, because in the second mode the voltage of the pulse width modulation voltage feed-in end VPWM is fixed and the voltage of the pulse amplitude modulation voltage feed-in end VPAM is adjustable, the signals SigR1, SigG1, SigB1 transmitted to the pulse width modulation circuit PWM of the sub-pixel driving circuits PXr, PXg, PXb will have the same fixed strength (as shown in FIG. 4C). On the other hand, the signals SigR2, SigG2, SigB2 transmitted to the pulse amplitude modulation circuit PAM of the sub-pixel driving circuits PXr, PXg, PXb may have different strengths (as shown in FIG. 4C). It should be noted that, the relative strengths of the signals SigR1, SigG1, SigB1, SigR2, SigG2, SigB2 shown in FIG. 4C do not intend to limit the present disclosure and are used merely as examples, illustrating that the signals SigR1, SigG1, SigB1 will have the same and fixed strength, and that the signals SigR2, SigG2, SigB2 can have adjustable strengths.

Figure 4D:
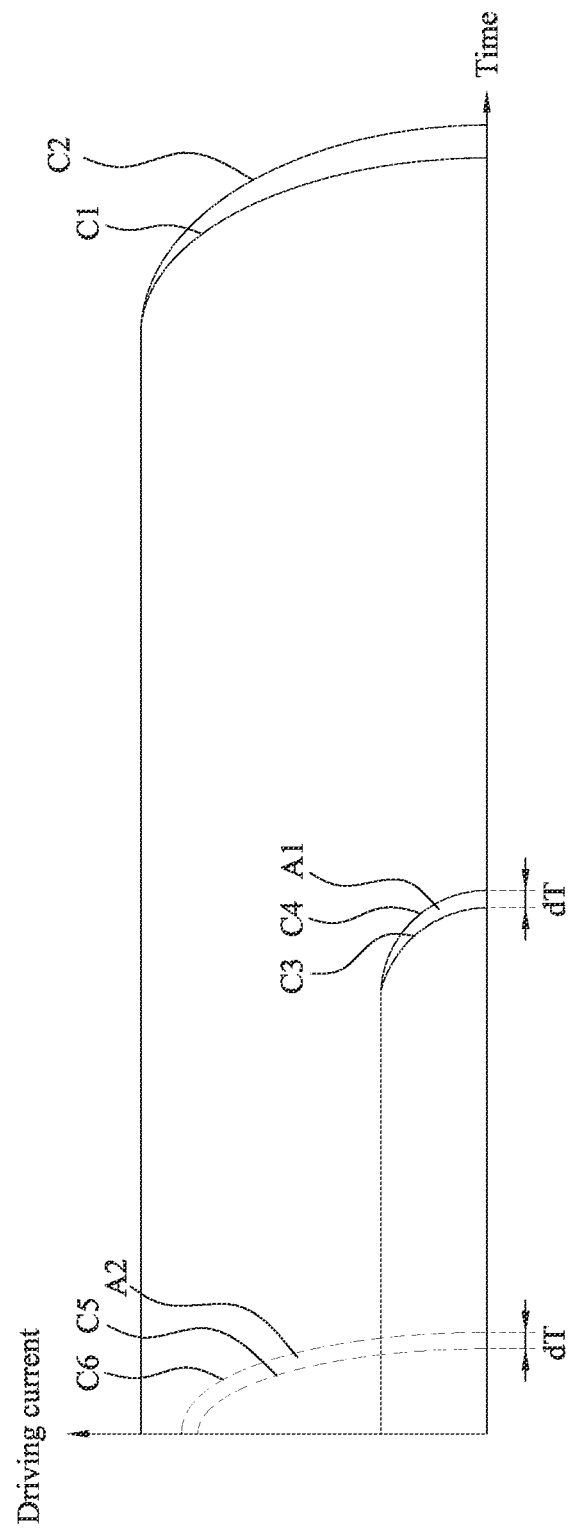
FIG. 4D is a diagram that shows a relationship between a driving current and time in the first mode and the second mode according to one embodiment of the present disclosure.

Please refer to FIG. 4D. FIG. 4D is a diagram that shows the relationship between the driving current and time in the first mode and the second mode according to one embodiment of the present disclosure. As previously stated, the driving circuit of the present disclosure uses the first mode when the gray level is high (i.e., when the brightness is high). In FIG. 4D, curves C1 and C2 represent the relationships between the driving currents of light emitting diodes located at different positions of the display and time in the first mode. In the first mode, the voltage of the pulse amplitude modulation voltage feed-in end VPAM is fixed, so a large driving current can be provided in order to reach the light emitting diodes' highest brightness and maximize the contrast of the display.

On the other hand, the present disclosure uses the second mode when the gray level is low (i.e., when the brightness is low). In FIG. 4D, curves C3 and C4 represent the relationships between the driving currents of light emitting diodes located at different positions of the display and time in the second mode. The light emitting diode represented by the curve C4 is relatively farther from the driving circuit of the display than the light emitting diode represented by the curve C3, so there will be a time difference dT (or, a signal delay) between the time when the control signals of the driving circuit turn off the two light emitting diodes. Such time difference dT will cause a brightness difference of the two light emitting diodes, and the brightness difference equals to the difference between the areas formed by the curves C3 and C4 (i.e., the area A1 in FIG. 4D).

It is worth noted that, in low gray levels, using the second mode, compared to not using the second mode, can reduce the non-uniformity in the brightness of light emitting diodes located in different positions. Curves C5 and C6 represent the relationships between the driving currents of light emitting diodes located at different positions of the display and time when the first mode is used in low gray levels. The control signals received by the light emitting diodes represented by the curves C5 and C6 will have the described time delay dT as well, and the brightness non-uniformity between such two light emitting diodes equals to the area A2. It can be observed from the curves C5 and C6 that when a large driving current is used in low gray levels, the light emitting time is reduced, and thus the time difference dT has a greater impact on the brightness difference of the light emitting diodes located at different positions. Because the ratio between the area A2 and the area formed by the curve C5 is greater than the ratio between the area A1 and the area formed by the curve C3, using the first mode in low gray levels will cause higher non-uniformity in brightness, compared to using the second mode. In other words, using the second mode in low gray levels can enhance the brightness uniformity among light emitting diodes located in different positions.

Figure 5A:
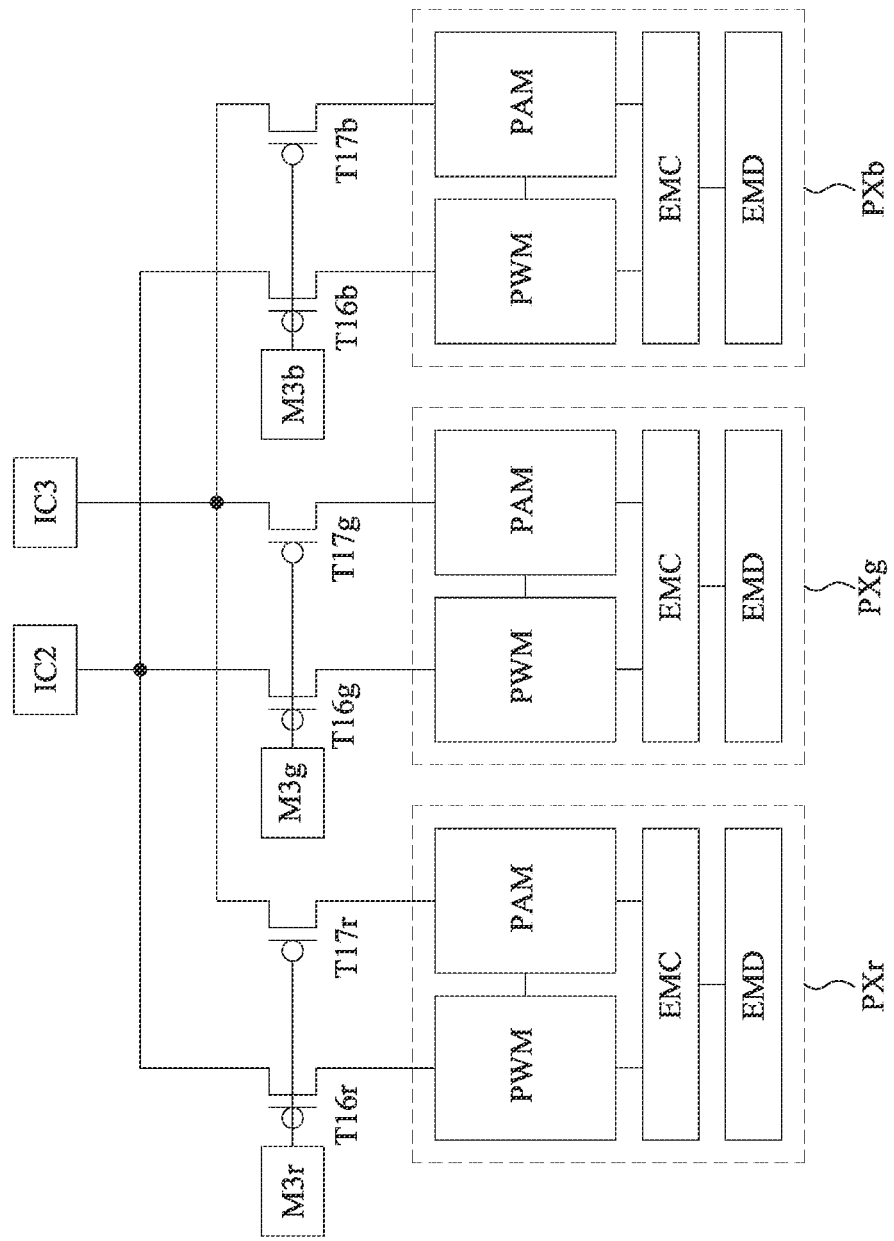
FIG. 5A is a circuit diagram of a driving circuit according to one embodiment of the present disclosure.

In an alternative embodiment, the driving circuit 100 can switch between the first mode and the second mode through different circuit configuration and signal transmissions. Please refer to FIG. 5A. FIG. 5A is a circuit diagram of a driving circuit 500 according to one embodiment of the present disclosure. In one embodiment, the driving circuit 500 includes the sub-pixel driving circuits PXr, PXg, PXb, the sixteenth transistors T16r, T16g, T16b, the third multiplexers M3r, M3g, M3b, and the seventeenth transistors T17r, T17g, T17b. The sub-pixel driving circuits PXr, PXg, PXb have the same components and connections as the driving circuit 100 in the embodiment shown in FIG. 1. The sixteenth transistor T16r, the third multiplexer M3r, and the seventeenth transistor T17r correspond to the sub-pixel driving circuit PXr, the sixteenth transistor T16g, the third multiplexer M3g, and the seventeenth transistor T17g correspond to the sub-pixel driving circuit PXg, and the sixteenth transistor T16b, the third multiplexer M3b, and the seventeenth transistor T17b correspond to the sub-pixel driving circuit PXb. Each of the sub-pixel driving circuits PXr, PXg, PXb has the same circuit configuration as the driving circuit 100 in the embodiment shown in FIG. 1.

Please refer to FIG. 1 and FIG. 5A. Following the previous embodiment, the voltages of the pulse width modulation voltage feed-in ends VPWM in the sub-pixel driving circuits PXr, PXg, PXb are provided by a second integrated circuit IC2, and the voltages of the pulse amplitude modulation voltage feed-in ends VPAM in the sub-pixel driving circuits PXr, PXg, PXb are provided by a third integrated circuit IC3.

The circuit configuration between the sub-pixel driving circuit PXr and the second integrated circuit IC2 and the third integrated circuit IC3 is described below. The first terminal of the sixteenth transistor T16r is electrically connected to the second integrated circuit IC2, and the second terminal of the sixteenth transistor T16r is electrically connected to the pulse width modulation voltage feed-in end VPWM of the pulse width modulation circuit PWM; the first terminal of the seventeenth transistor T17r is electrically connected to the third integrated circuit IC3, and the second terminal of the seventeenth transistor T17r is electrically connected to the pulse amplitude modulation voltage feed-in end VPAM of the pulse amplitude modulation circuit PAM; the third multiplexer M3r is electrically connected to the gate terminals of the sixteenth transistor T16r and the seventeenth transistor T17r and configured to determine when the sixteenth transistor T16r and the seventeenth transistor T17r conduct.

As shown in FIG. 5A, the circuit configuration between the sub-pixel driving circuit PXg and the second integrated circuit IC2 and the third integrated circuit IC3 is similar to the circuit configuration between the sub-pixel driving circuit PXr and the second integrated circuit IC2 and the third integrated circuit IC3 described above. In other words, the pulse width modulation circuit PWM of the sub-pixel driving circuit PXg is electrically connected to the second integrated circuit IC2 through the sixteenth transistor T16g, the pulse amplitude modulation circuit PAM of the sub-pixel driving circuit PXg is electrically connected to the third integrated circuit IC3 through the seventeenth transistor T17g, and the third multiplexer M3g is electrically connected to the gate terminals of the sixteenth transistor T16g and the seventeenth transistor T17g. Likewise, the circuit configuration between the sub-pixel driving circuit PXb and the second integrated circuit IC2 and the third integrated circuit IC3 is similar to the circuit configuration between the sub-pixel driving circuit PXr/PXg and the second integrated circuit IC2 and the third integrated circuit IC3.

In one embodiment, as shown in FIG. 5A, the first terminals of the sixteenth transistors T16r, T16g, T16b are electrically connected together, and the first terminals of the seventeenth transistors T17r, T17g, T17b are electrically connected together.

Figures 5B, 5C:
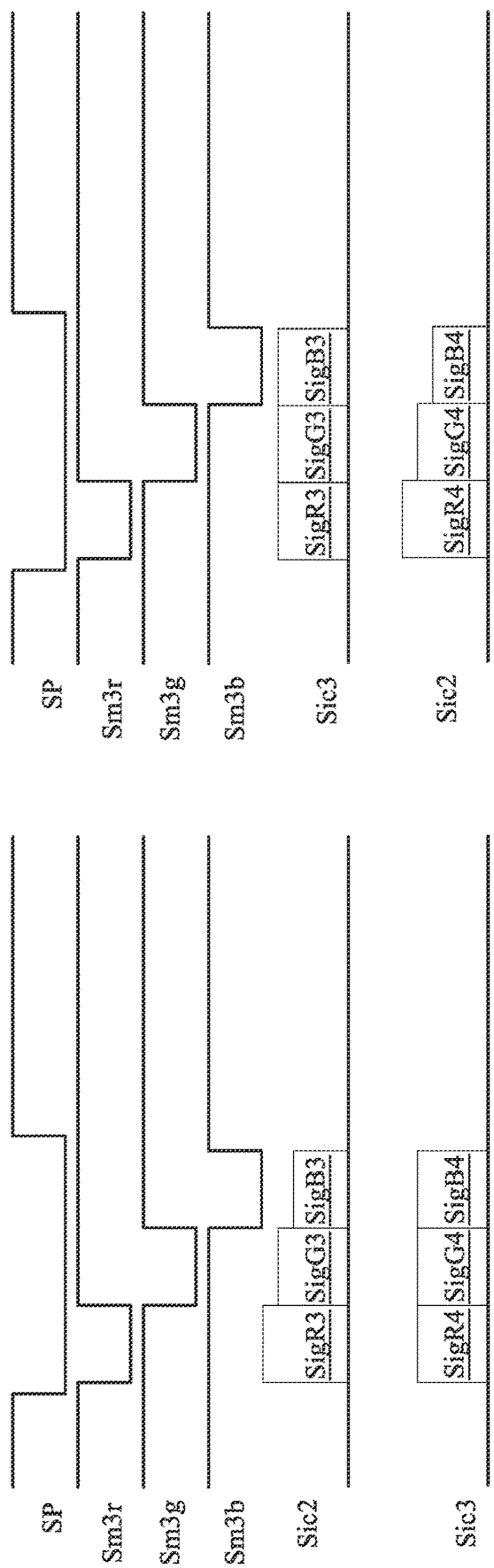
FIG. 5B is a timing diagram of control signals of the driving circuit in FIG. 5A in a first mode according to one embodiment of the present disclosure.
FIG. 5C is a timing diagram of control signals of the driving circuit in FIG. 5A in a second mode according to one embodiment of the present disclosure.

Below describe the control signals that the driving circuit 500 receives in the first mode. Please refer to FIG. 5A and FIG. 5B. FIG. 5B is a timing diagram of control signals of the driving circuit 500 in FIG. 5A in the first mode according to one embodiment of the present disclosure. In one embodiment, the second integrated circuit IC2 is configured to transmit signal Sic2 to the sub-pixel driving circuits PXr, PXg, PXb, the signal Sic2 includes signals SigR3, SigG3, SigB3, the third integrated circuit IC3 is configured to transmit signal Sic3 to the sub-pixel driving circuits PXr, PXg, PXb, and the signal Sic3 includes signals SigR4, SigG4, SigB4. The third multiplexer M3r is configured to transmit the control signal Sm3r to the gate terminals of the sixteenth transistor T16r and the seventeenth transistor T17r, the third multiplexer M3g is configured to transmit the control signal Sm3g to the gate terminals of the sixteenth transistor T16g and the seventeenth transistor T17g, the third multiplexer M3b is configured to transmit the control signal Sm3b to the gate terminals of the sixteenth transistor T16b and the seventeenth transistor T17b.

As shown in FIG. 5B, in this embodiment, when the third control signal SP has a low logic level (i.e., when the sub-pixel driving circuits PXr, PXg, PXb operate during the data writing period P2 as the embodiment shown in FIG. 3B), the second integrated circuit IC2 transmits the signal Sic2 to the sub-pixel driving circuits PXr, PXg, PXb, the third integrated circuit IC3 transmits the signal Sic3 to the sub-pixel driving circuits PXr, PXg, PXb, in order to write the signals SigR3, SigG3, SigB3, SigR4, SigG4, SigB4 into the gate terminals of the third transistor T3 and the first transistor T1 in the sub-pixel driving circuits PXr, PXg, PXb (please refer to FIG. 3B).

Specifically, as shown in FIG. 5B, first, the second integrated circuit IC2 outputs the signal SigR3 and the third integrated circuit IC3 outputs the signal SigR4, and at this time, the control signal Sm3r is the only signal having a low logic level, other than the third control signal SP. Thus, the sixteenth transistor T16r and the seventeenth transistor T17r conducts, the signal SigR3 is transmitted to the pulse width modulation circuit PWM of the sub-pixel driving circuit PXr, and the signal SigR4 is transmitted to the pulse amplitude modulation circuit PAM of the sub-pixel driving circuit PXr.

Then, the second integrated circuit IC2 outputs the signal SigG3 and the third integrated circuit IC3 outputs the signal SigG4, and at this time, the control signal Sm3g is the only signal having a low logic level, other than the third control signal SP. Thus, the sixteenth transistor T16g and the seventeenth transistor T17g conduct, the signal SigG3 is transmitted to the pulse width modulation circuit PWM of the PXg, and the signal SigG4 is transmitted to the pulse amplitude modulation circuit PAM of the PXg.

Then, the second integrated circuit IC2 outputs the signal SigB3 and the third integrated circuit IC3 outputs the signal SigB4, and at this time, the control signal Sm3b is the only signal having a low logic level, other than the third control signal SP. Thus, the sixteenth transistor T16b and the seventeenth transistor T17b conduct, the signal SigB3 is transmitted to the pulse width modulation circuit PWM of the sub-pixel driving circuit PXb, and the signal SigB4 is transmitted to the pulse amplitude modulation circuit PAM of the sub-pixel driving circuit PXb.

It is worth noted that, because in the first mode the voltage of the pulse width modulation voltage feed-in end VPWM is adjustable and the voltage of the pulse amplitude modulation voltage feed-in end VPAM is fixed, the signals SigR3, SigG3, SigB3 transmitted to the pulse width modulation circuits PWM of the sub-pixel driving circuits PXr, PXg, PXb by the second integrated circuit IC2 may have different strengths (as shown in FIG. 5B). On the other hand, the signals SigR4, SigG4, SigB4 transmitted to the pulse amplitude modulation circuits PAM of the sub-pixel driving circuits PXr, PXg, PXb by the third integrated circuit IC3 will have the same fixed strength (as shown in FIG. 5B). It should be noted that, the relative strengths of the signals SigR3, SigG3, SigB3, SigR4, SigG4, SigB4 do not intend to limit the present disclosure and are used merely as examples, illustrating that the signals SigR3, SigG3, SigB3 can have adjustable strengths, and that the signals SigR4, SigG4, SigB4 will have the same and fixed strength.

As to the control signals of the driving circuit 500 in the second mode, please refer to FIG. 5C. FIG. 5C is a timing diagram of control signals of the driving circuit 500 in FIG. 5A in the second mode according to one embodiment of the present disclosure. In the embodiment of FIG. 5C, the control signals Sm3r, Sm3g, Sm3b have low logic levels at different time periods, and the second integrated circuit IC2 and the third integrated circuit IC3 output the corresponding signals SigR3, SigG3, SigB3, SigR4, SigG4, SigB4 at those time periods. For example, first, the second integrated circuit IC2 outputs the signal SigR3 and the third integrated circuit IC3 outputs the signal SigR4, and at this time, the control signal Sm3r is the only signal having a low logic level, other than the third control signal SP. Thus, the sixteenth transistor T16r and the seventeenth transistor T17r conduct, the signal SigR3 is transmitted to the pulse width modulation circuit PWM of the sub-pixel driving circuit PXr, and the signal SigR4 is transmitted to the pulse amplitude modulation circuit PAM of the sub-pixel driving circuit PXr. The transmissions of other signals (i.e., signals SigG3, SigB3, SigG4, SigB4) can refer to the relevant description above.

It is worth noted that, because in the second mode the voltage of the pulse width modulation voltage feed-in end VPWM is fixed and the voltage of the pulse amplitude modulation voltage feed-in end VPAM is adjustable, the signals SigR3, SigG3, SigB3 transmitted to the pulse width modulation circuits PWM of the sub-pixel driving circuits PXr, PXg, PXb will have the same fixed strength (as shown in FIG. 5C). On the other hand, the signals SigR4, SigG4, SigB4 transmitted to the pulse amplitude modulation circuits PAM of the sub-pixel driving circuits PXr, PXg, PXb may have different strengths (as shown in FIG. 5C). It should be noted that, the relative strengths of the signals SigR3, SigG3, SigB3, SigR4, SigG4, SigB4 shown in FIG. 5C do not intend to limit the present disclosure and are used merely as examples, illustrating that the signals SigR3, SigG3, SigB3 will have the same and fixed strength, and that the signals SigR4, SigG4, SigB4 can have adjustable strengths.

Likewise, by switching to the second mode when the gray level is low, the driving circuit 500 can enhance the uniformity in brightness of light emitting diodes located at different positions. Please refer to the relevant description of the embodiment shown in FIG. 4D.

Figure 6A:
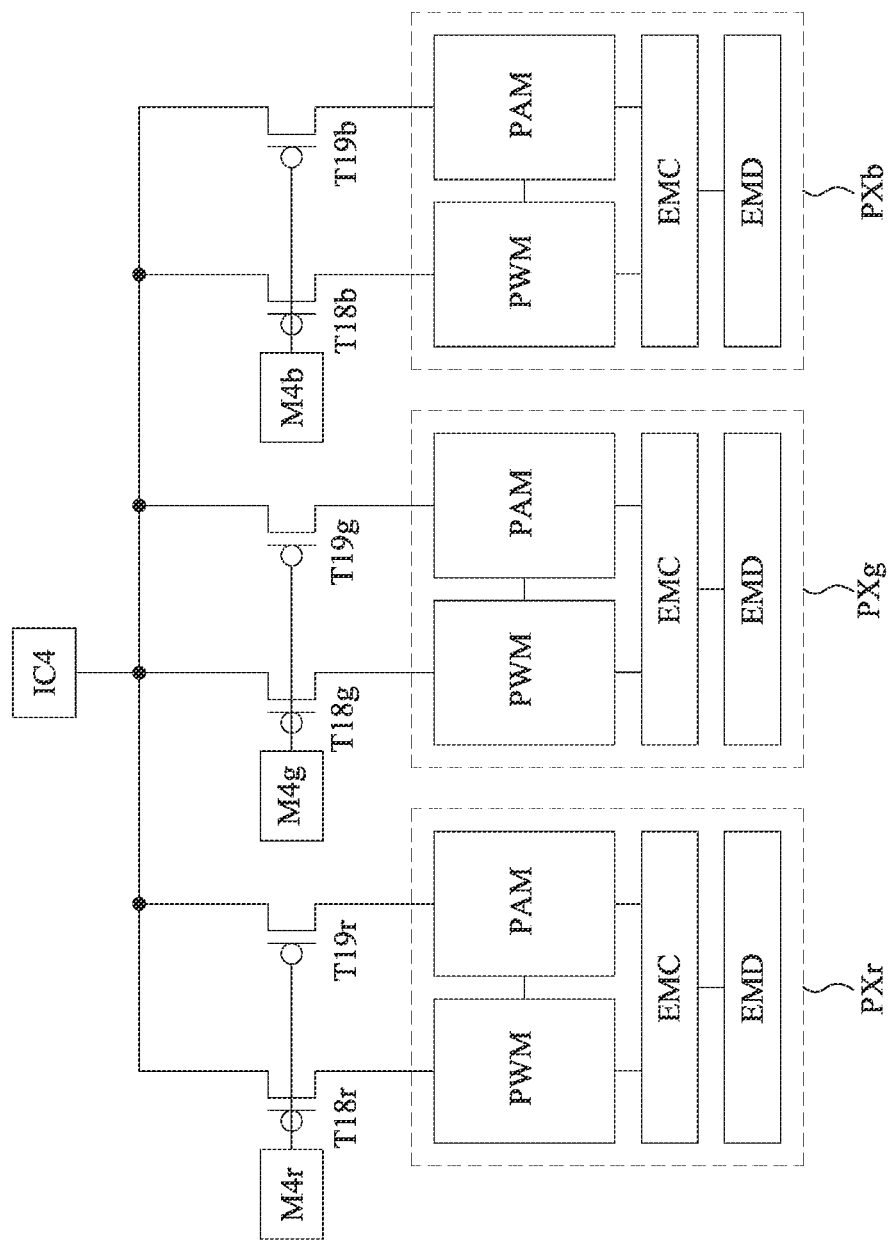
FIG. 6A is a circuit diagram of a driving circuit according to one embodiment of the present disclosure.

In an alternative embodiment, the driving circuit 100 can switch between the first mode and the second mode through different circuit configuration and signal transmissions. Please refer to FIG. 6A. FIG. 6A is a circuit diagram of a driving circuit 600 according to one embodiment of the present disclosure. In one embodiment, the driving circuit 600 includes the sub-pixel driving circuits PXr, PXg, PXb, the eighteenth transistors T18r, T18g, T18b, the fourth multiplexers M4r, M4g, M4b, and the nineteenth transistors T19r, T19g, T19b. The eighteenth transistor T18r, the fourth multiplexer M4r, and the nineteenth transistor T19r correspond to the sub-pixel driving circuit PXr, the eighteenth transistor T18g, the fourth multiplexer M4g, and the nineteenth transistor T19g correspond to the sub-pixel driving circuit PXg, and the eighteenth transistor T18b, the fourth multiplexer M4b, and the nineteenth transistor T19b correspond to the sub-pixel driving circuit PXb.

Figure 6B:
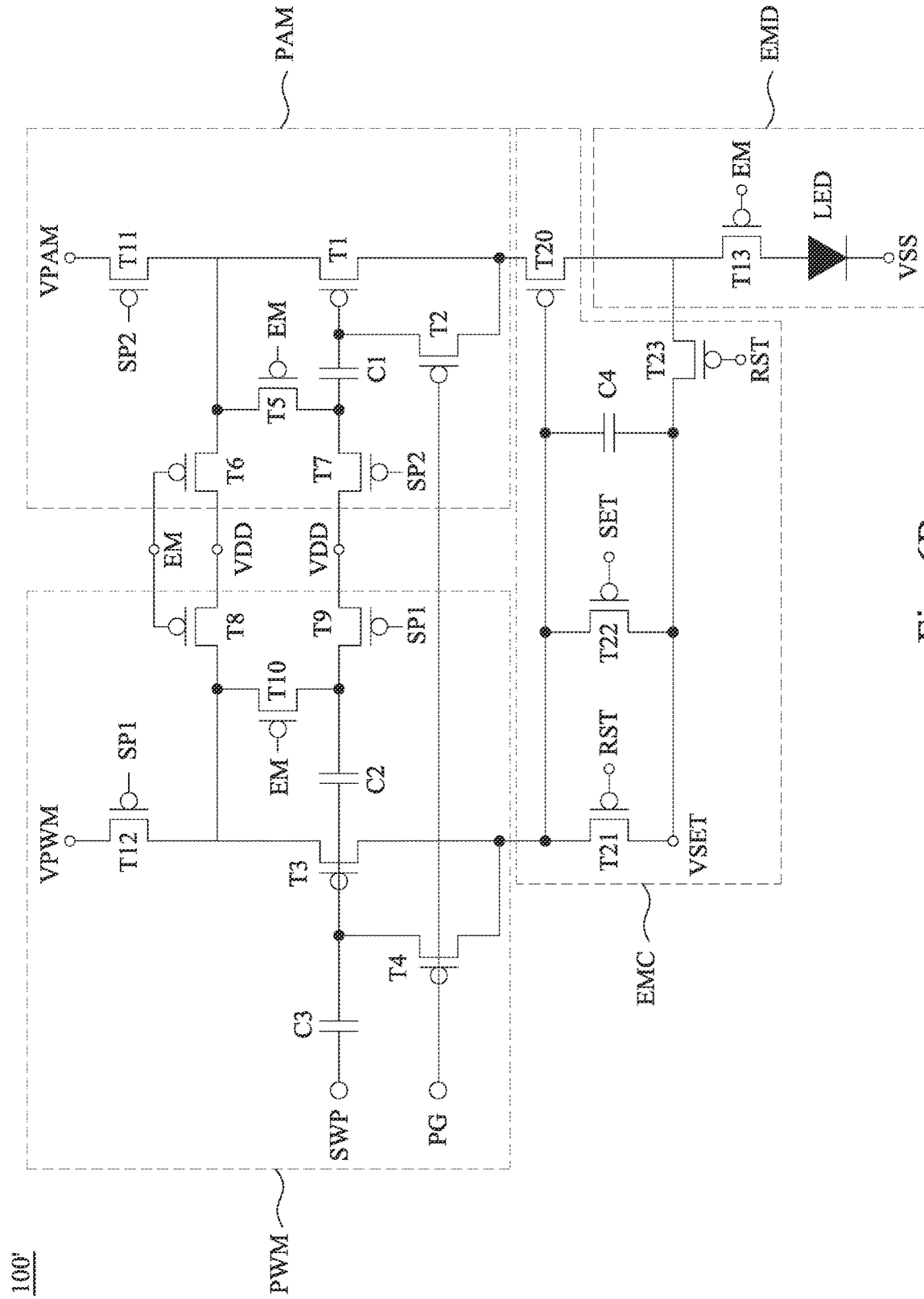
FIG. 6B is a circuit diagram of a driving circuit according to one embodiment of the present disclosure.

The sub-pixel driving circuits PXr, PXg, PXb in the embodiment shown in FIG. 6A have the components and connections similar to the driving circuit 100 in the embodiment shown in FIG. 1, but the received control signals are different. Please refer to FIG. 1 and FIG. 6B. FIG. 6B is a circuit diagram of a driving circuit 100' according to one embodiment of the present disclosure. Each of the sub-pixel driving circuits PXr, PXg, PXb has a circuit configuration of the driving circuit 100'. The driving circuit 100' has the same components and connections as those in the driving circuit 100 in FIG. 1, but in the driving circuit 100', as shown in FIG. 6B, the gate terminals of the ninth transistor T9 and the twelfth transistor T12 are configured to receive the fourth control signal SP1, and the gate terminals of the seventh transistor T7 and the eleventh transistor T11 are configured to receive the fifth control signal SP2. In contrast, in the driving circuit 100 in FIG. 1, the gate terminals of the ninth transistor T9, the twelfth transistor T12, the seventh transistor T7, and the eleventh transistor T11 are configured to receive the same third control signal SP.

Please refer to FIG. 6A and FIG. 6B. The voltages of the pulse width modulation voltage feed-in ends VPWM and the pulse amplitude modulation voltage feed-in ends VPAM in the sub-pixel driving circuits PXr, PXg, PXb are provided by a fourth integrated circuit IC4. The first terminal of the eighteenth transistor T18r is electrically connected to the fourth integrated circuit IC4, and the second terminal of the eighteenth transistor T18r is electrically connected to the pulse width modulation voltage feed-in end VPWM of the pulse width modulation circuit PWM; the first terminal of the nineteenth transistor T19r is electrically connected to the fourth integrated circuit IC4, and the second terminal of the nineteenth transistor T19r is electrically connected to the pulse amplitude modulation voltage feed-in end VPAM of the pulse amplitude modulation circuit PAM; the fourth multiplexer M4r is electrically connected to the gate terminals of the eighteenth transistor T18r and the nineteenth transistor T19r and is configured to control the time when the eighteenth transistor T18r and the nineteenth transistor T19r conduct.

As shown in FIG. 6A, the circuit configuration between the sub-pixel driving circuit PXg and the fourth integrated circuit IC4 is similar to the circuit configuration between the sub-pixel driving circuit PXr and the fourth integrated circuit IC4 described above. In other words, the pulse width modulation circuit PWM of the sub-pixel driving circuit PXg is electrically connected to the fourth integrated circuit IC4 through the eighteenth transistor T18g, the pulse amplitude modulation circuit PAM of the sub-pixel driving circuit PXg is electrically connected to the fourth integrated circuit IC4 through the nineteenth transistor T19g, and the fourth multiplexer M4g is electrically connected to the gate terminals of the eighteenth transistor T18g and the nineteenth transistor T19g. Likewise, the circuit configuration between the sub-pixel driving circuit PXb and the fourth integrated circuit IC4 is similar to the circuit configuration between the sub-pixel driving circuit PXr/PXg and the fourth integrated circuit IC4.

In one embodiment, as shown in FIG. 6A, the first terminals of the eighteenth transistor T18r, T18g, T18b are electrically connected together, and the first terminals of the nineteenth transistors T19r, T19g, T19b are electrically connected together.

Below describe the control signals that the driving circuit 600 has in the first mode. Please refer to FIG. 6A and FIG. 6C. FIG. 6C is a timing diagram of control signals of the driving circuit 600 in FIG. 6A in the first mode according to one embodiment of the present disclosure. In one embodiment, the fourth integrated circuit IC4 is configured to transmit signal Sic4 to the sub-pixel driving circuits PXr, PXg, PXb, the signal Sic4 includes signals SigR5, SigG5, SigB5, SigR6, SigG6, SigB6, the fourth multiplexer M4r is configured to transmit the control signal Sm4r to the gate terminals of the eighteenth transistor T18r and the nineteenth transistor T19r, the fourth multiplexer M4g is configured to transmit the control signal Sm4g to the gate terminals of the eighteenth transistor T18g and the nineteenth transistor T19g, the fourth multiplexer M4b is configured to transmit the control signal Sm4b to the gate terminals of the eighteenth transistor T18b and the nineteenth transistor T19b.

Please refer to FIG. 6A, FIG. 6B, and FIG. 6C. When the fourth control signal SP1 has a low logic level, the fourth integrated circuit IC4 transmits the signals SigR5, SigG5, SigB5 to the pulse width modulation circuits PWM of the sub-pixel driving circuits PXr, PXg, PXb, in order to write the signals SigR5, SigG5, SigB5 into the gate terminal of the third transistor T3 in the sub-pixel driving circuits PXr, PXg, PXb. When the fifth control signal SP2 has a low logic level, the fourth integrated circuit IC4 transmits the signals SigR6, SigG6, SigB6 to the pulse amplitude modulation circuits PAM of the sub-pixel driving circuits PXr, PXg, PXb, in order to write the signals SigR6, SigG6, SigB6 into the gate terminal of the first transistor T1 in the sub-pixel driving circuits PXr, PXg, PXb.

Specifically, as shown in FIG. 6C, first, the fourth integrated circuit IC4 outputs the signal SigR5, and at this time, the control signal Sm4r is the only signal having a low logic level, other than the fourth control signal SP1. Thus, the eighteenth transistor T18r and the nineteenth transistor T19r conduct, and the signal SigR5 is transmitted to the pulse width modulation circuit PWM and the pulse amplitude modulation circuit PAM of the sub-pixel driving circuit PXr. Yet, because the fifth control signal SP2 has a high logic level at this time, the eleventh transistor T11 in the pulse amplitude modulation circuit PAM of the sub-pixel driving circuit PXr does not conduct (please refer to FIG. 6B), and the signal SigR5 is not written into the gate terminal of the first transistor T1.

Then, the fourth integrated circuit IC4 outputs the signal SigG5, and at this time, the control signal Sm4g is the only signal having low logic level, other than the fourth control signal SP1. Thus, the eighteenth transistor T18g and the nineteenth transistor T19g conduct, and the signal SigG5 is transmitted to the pulse width modulation circuit PWM and the pulse amplitude modulation circuit PAM of the sub-pixel driving circuit PXg. Yet, because the fifth control signal SP2 has a high logic level at this time, the eleventh transistor T11 in the pulse amplitude modulation circuit PAM of the sub-pixel driving circuit PXg does not conduct (please refer to FIG. 6B), and the signal SigG5 is not written into the gate terminal of the first transistor T1.

Then, the fourth integrated circuit IC4 outputs the signal SigB5, and at this time, the control signal Sm4b is the only signal having a low logic level, other than the fourth control signal SP1. Thus, the eighteenth transistor T18b and the nineteenth transistor T19b conduct, and the signal SigB5 is transmitted to the pulse width modulation circuit PWM and the pulse amplitude modulation circuit PAM of the sub-pixel driving circuit PXb. Yet, because the fifth control signal SP2 has a high logic level at this time, the eleventh transistor T11 in the pulse amplitude modulation circuit PAM of the sub-pixel driving circuit PXb does not conduct (please refer to FIG. 6B), and the signal SigB5 is not written into the gate terminal of the first transistor T1.

Then, the fourth integrated circuit IC4 outputs the signal SigR6, and at this time, the control signal Sm4r is the only signal having a low logic level, other than the fifth control signal SP2. Thus, the eighteenth transistor T18r and the nineteenth transistor T19r conduct, and the signal SigR6 is transmitted to the pulse width modulation circuit PWM and the pulse amplitude modulation circuit PAM of the sub-pixel driving circuit PXr. Yet, because the fourth control signal SP1 has a high logic level at this time, the twelfth transistor T12 in the pulse width modulation circuit PWM of the sub-pixel driving circuit PXr does not conduct (please refer to FIG. 6B), and the signal SigR6 is not written into the gate terminal of the third transistor T3.

Then, the fourth integrated circuit IC4 outputs the signal SigG6, and at this time, the control signal Sm4g is the only signal having a low logic level, other than the fifth control signal SP2. Thus, the eighteenth transistor T18g and the nineteenth transistor T19g conduct, and the signal SigG6 is transmitted to the pulse width modulation circuit PWM and the pulse amplitude modulation circuit PAM of the sub-pixel driving circuit PXg. Yet, because the fourth control signal SP1 has a high logic level at this time, the twelfth transistor T12 in the pulse width modulation circuit PWM of the sub-pixel driving circuit PXg does not conduct (please refer to FIG. 6B), and the signal SigG6 is not written into the gate terminal of the third transistor T3.

Then, the fourth integrated circuit IC4 outputs the signal SigB6, and at this time, the control signal Sm4b is the only signal having a low logic level, other than the fifth control signal SP2. Thus, the eighteenth transistor T18b and the nineteenth transistor T19b conduct, and the signal SigB6 is transmitted to the pulse width modulation circuit PWM and the pulse amplitude modulation circuit PAM of the sub-pixel driving circuit PXb. Yet, because the fourth control signal SP1 has a high logic level at this time, the twelfth transistor T12 in the pulse width modulation circuit PWM of the sub-pixel driving circuit PXb does not conduct (please refer to FIG. 6B), and the signal SigB6 is not written into the gate terminal of the third transistor T3.

It is worth noted that, because in the first mode the voltage of the pulse width modulation voltage feed-in end VPWM is adjustable and the voltage of the pulse amplitude modulation voltage feed-in end VPAM is fixed, the signals SigR5, SigG5, SigB5 transmitted to the pulse width modulation circuit PWM of the sub-pixel driving circuits PXr, PXg, PXb by the fourth integrated circuit IC4 may have different strengths (as shown in FIG. 6C). On the other hand, the signals SigR6, SigG6, SigB6 transmitted to the pulse amplitude modulation circuit PAM of the sub-pixel driving circuits PXr, PXg, PXb by the fourth integrated circuit IC4 will have the same fixed strength (as shown in FIG. 6C). It should be noted that, the relative strengths of the signals SigR5, SigG5, SigB5, SigR6, SigG6, SigB6 do not intend to limit the present disclosure and are used merely as examples, illustrating that the signals SigR5, SigG5, SigB5 can have adjustable strengths, and that the signals SigR6, SigG6, SigB6 will have the same and fixed strength.

As to the control signals of the driving circuit 600 in the second mode, please refer to FIG. 6D. FIG. 6D is a timing diagram of control signals of the driving circuit 600 in FIG. 6A in the second mode according to one embodiment of the present disclosure. In the embodiment of FIG. 6D, the control signals Sm4r, Sm4g, Sm4b have low logic levels at different time periods, and the fourth integrated circuit IC4 outputs the corresponding signals SigR5, SigG5, SigB5, SigR6, SigG6, SigB6 at those time periods. For example, first, the fourth integrated circuit IC4 outputs the signal SigR5, and at this time, the control signal Sm4r is the only signal having a low logic level, other than the fourth control signal SP1. Thus, the eighteenth transistor T18r and the nineteenth transistor T19r conduct, and the signal SigR5 is transmitted to the pulse width modulation circuit PWM and the pulse amplitude modulation circuit PAM of the sub-pixel driving circuit PXr. Yet, because the fifth control signal SP2 has a high logic level at this time, the eleventh transistor T11 in the pulse amplitude modulation circuit PAM of the sub-pixel driving circuit PXr does not conduct (please refer to FIG. 6B), and the signal SigR5 is not written into the gate terminal of the first transistor T1. As to the transmissions of other signals (i.e., signals SigG5, SigB5, SigR6, SigG6, SigB6), please refer to the previous relevant description.

It is worth noted that, because in the second mode the voltage of the pulse width modulation voltage feed-in end VPWM is fixed and the voltage of the pulse amplitude modulation voltage feed-in end VPAM is adjustable, the signals SigR5, SigG5, SigB5 transmitted to the pulse width modulation circuits PWM of the sub-pixel driving circuits PXr, PXg, PXb by the fourth integrated circuit IC4 will have the same fixed strength (as shown in FIG. 6D). On the other hand, the signals SigR6, SigG6, SigB6 transmitted to the pulse amplitude modulation circuits PAM of the sub-pixel driving circuits PXr, PXg, PXb by the fourth integrated circuit IC4 may have different strengths (as shown in FIG. 6D). It should be noted that, the relative strengths of the signals SigR5, SigG5, SigB5, SigR6, SigG6, SigB6 shown in FIG. 6D do not intend to limit the present disclosure and are used merely as examples, illustrating that the signals SigR5, SigG5, SigB5 will have the same and fixed strength, and that the signals SigR6, SigG6, SigB6 can have adjustable strengths.

Likewise, by switching to the second mode when the gray level is low, the driving circuit 600 can enhance the uniformity in brightness of light emitting diodes located at different positions. Please refer to the relevant description of FIG. 4D mentioned above.

In conclusion, through the circuit configuration shown in FIG. 4A, FIG. 5A, FIG. 6A, and FIG. 6B and signal transmission shown in FIG. 4B, FIG. 4C, FIG. 5B, FIG. 5C, FIG. 6C, and FIG. 6D, the driving circuit of the present disclosure can use the first mode or the second mode use different modes according to different gray level, so that the brightness uniformity of the display can be enhanced.

Figure 7:
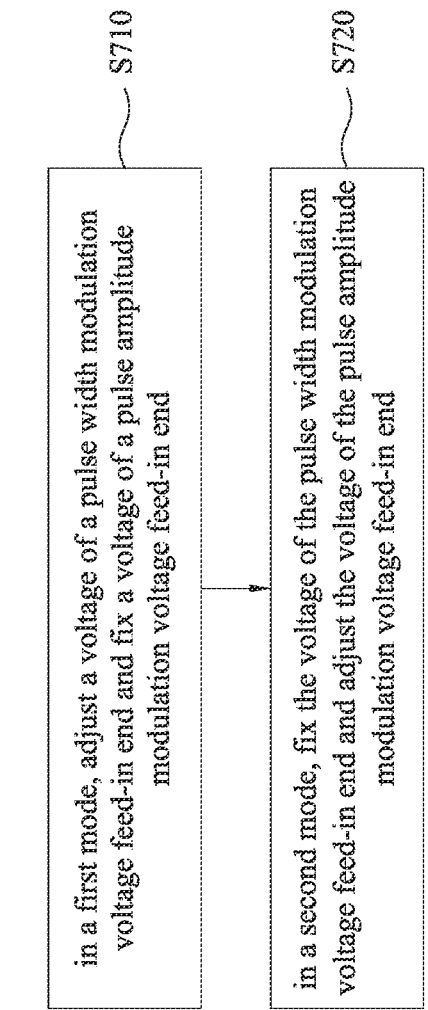
FIG. 7 is a flow chart of a driving method according to one embodiment of the present disclosure.

According to the previous description of various embodiments, the present disclosure also discloses a driving method. Please refer to FIG. 7. FIG. 7 is a flow chart of a driving method 700 according to one embodiment of the present disclosure. The driving method 700 is configured to drive a pixel circuit (such as the driving circuit 100 in FIG. 1 or the driving circuit 100' in FIG. 6B). As shown in FIG. 7, the driving method 700 includes steps S710 and S720.

In the step S710, in a first mode, adjust a voltage of a pulse width modulation voltage feed-in end of the pixel circuit, and fix a voltage of a pulse amplitude modulation voltage feed-in end of the pixel circuit. As to how to adjust the voltage of the pulse width modulation voltage feed-in end and fix the voltage of the pulse amplitude modulation voltage feed-in end, previous descriptions of the embodiments in FIG. 4A, FIG. 4B, FIG. 5A, FIG. 5B, FIG. 6A, and FIG. 6C can be referred to. It should be noted that these embodiments are merely exemplary circuit configurations and control signals that can perform the driving method 700. Person having ordinary in the art can use similar circuit configurations and control signals to perform the driving method 700, and those circuit configurations and control signals should be deemed to be disclosed by the present disclosure.

In the step S720, in a second mode, fix the voltage of the pulse width modulation voltage feed-in end, and fix the voltage of the pulse amplitude modulation voltage feed-in end. Previous descriptions of the embodiments in FIG. 4A, FIG. 4C, FIG. 5A, FIG. 5C, FIG. 6A, and FIG. 6D can be referred to. It should be noted that these embodiments are merely exemplary circuit configurations and control signals that can perform the driving method 700. Person having ordinary in the art can use similar circuit configurations and control signals to perform the driving method 700, and those circuit configurations and control signals should be deemed to be disclosed by the present disclosure.

In the driving method 700, the voltage of the pulse width modulation voltage feed-in end controls a lasting time of a driving signal, and the voltage of the pulse amplitude modulation voltage feed-in end controls the strength of the driving signal.

It should be noted that, in one embodiment, the step S710 and the step S720 can be performed in the opposite order. In one embodiment, the driving method 700 uses the first mode or the second mode according to the gray level of the display. For example, in a 8-bit gray level, when the gray level is greater than or equals to the eleventh level, the driving method uses the first mode to drive light emitting diodes, and when the gray level is smaller than the eleventh level, the driving method uses the second mode to drive light emitting diodes.

In conclusion, the driving method 700 applies different voltage to the pulse width modulation voltage feed-in end and the pulse amplitude modulation voltage feed-in end in the first mode and in the second mode, so that the brightness uniformity of a display is enhanced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A driving circuit comprising:
    a pulse amplitude modulation circuit, configured to control a strength of a driving signal, the pulse amplitude modulation circuit comprising:
        a first transistor;
        a first capacitor, its first terminal being electrically connected to the first transistor's gate terminal; and
        a second transistor, its first terminal being electrically connected to the first capacitor's first terminal, its second terminal being electrically connected to the first transistor's second terminal; and
    a pulse width modulation circuit, configured to control a lasting time of the driving signal, the pulse width modulation circuit comprising:
        a second capacitor;
        a third transistor, its gate terminal being electrically connected to the second capacitor's second terminal; and
        a fourth transistor, its first terminal being electrically connected to the third transistor's gate terminal, its second terminal being electrically connected to the third transistor's second terminal, its gate terminal being electrically connected to the second transistor's gate terminal and configured to receive a first control signal.

2. The driving circuit of claim 1, wherein:
    the pulse amplitude modulation circuit further comprises:
        a fifth transistor, its first terminal being electrically connected to the first transistor's first terminal, its second terminal being electrically connected to the first capacitor's second terminal, its gate terminal being configured to receive a light emitting signal;
        a sixth transistor, its first terminal being electrically connected to the fifth transistor's first terminal, its second terminal being electrically connected to a first system voltage terminal, its gate terminal being configured to receive the light emitting signal; and
        a seventh transistor, its first terminal being electrically connected to the fifth transistor's second terminal, its second terminal being electrically connected to the first system voltage terminal; and
    the pulse width modulation circuit further comprises:
        an eighth transistor, its first terminal being electrically connected to the first system voltage terminal, its second terminal being electrically connected to the third capacitor's first terminal, its gate terminal being configured to receive the light emitting signal;
        a ninth transistor, its first terminal being electrically connected to the first system voltage terminal, its second terminal being electrically connected to the second capacitor's first terminal; and
        a tenth transistor, its first terminal being electrically connected to the eighth transistor's second terminal, its second terminal being electrically connected to the ninth transistor's second terminal, its gate terminal being configured to receive the light emitting signal.

3. The driving circuit of claim 2, wherein:
    the pulse amplitude modulation circuit further comprises:
        an eleventh transistor, its first terminal being electrically connected to a pulse amplitude modulation voltage feed-in end, its second terminal being electrically connected to the first transistor's first terminal; and
    the pulse width modulation circuit further comprises:
        a twelfth transistor, its first terminal being electrically connected to a pulse width modulation voltage feed-in end, its second terminal being electrically connected to the third transistor's first terminal; and
        a third capacitor, its first terminal being electrically connected to the third transistor's gate terminal, its second terminal being configured to receive a second control signal.

4. The driving circuit of claim 3, wherein the second control signal is a triangle wave that varies between a high logic level and a low logic level.

5. The driving circuit of claim 3, wherein the driving circuit uses a first mode and a second mode to drive the light emitting diode according to different gray levels;
    in the first mode, the voltage of the pulse width modulation voltage feed-in end is adjustable, and the voltage of the pulse amplitude modulation voltage feed-in end is fixed; and
    in the second mode, the voltage of the pulse width modulation voltage feed-in end is fixed, and the voltage of the pulse amplitude modulation voltage feed-in end is adjustable.

6. The driving circuit of claim 3, further comprising:
    a light emitting control circuit, electrically connected to the pulse amplitude modulation circuit and the pulse width modulation circuit;
    a thirteenth transistor, its first terminal being electrically connected to the light emitting control circuit, its gate terminal being configured to receive the light emitting signal; and
    a light emitting diode, its anode being electrically connected to the thirteenth transistor's second terminal, its cathode being electrically connected to a second system voltage terminal.

7. The driving circuit of claim 6, wherein:
    the gate terminals of the seventh transistor, the ninth transistor, the eleventh transistor, and the twelfth transistor are all configured to receive a third control signal.

8. The driving circuit of claim 7, wherein the driving circuit sequentially operates in a reset period, a data writing period, a current conducting period, and a light emitting period;
    during the reset period, the first control signal has a low logic level, and the second control signal, the third control signal, and the light emitting signal have high logic levels;
    during the data writing period, the first control signal and the third control signal have low logic levels, and the light emitting signal and the second control signal have high logic levels;

during the current conducting period, the first control signal, the second control signal, the third control signal, and the light emitting signal have high logic levels; and during the light emitting period, the first control signal and the third control signal have high logic levels, the light emitting signal has a low logic level, and the second control signal have a logic level that starts with a high level and then declines to a low level.

9. The driving circuit of claim 6, wherein:

the gate terminals of the ninth transistor and the twelfth transistor are configured to receive a fourth control signal, and the gate terminals of the seventh transistor and the eleventh transistor are configured to receive a fifth control signal.

10. The driving circuit of claim 9, wherein the driving circuit sequentially operates in a reset period, a data writing period, a current conducting period, and a light emitting period;

during the data writing period, first, the fourth control signal has a low logic level and the fifth control signal has a high logic level, and then the fourth control signal has a high logic level and the fifth control signal has a low logic level.

11. The driving circuit of claim 6, further comprising:

a fourteenth transistor, its first terminal being electrically connected to a first integrated circuit, its second terminal being electrically connected to the pulse width modulation voltage feed-in end;

a first multiplexer, electrically connected to the fourteenth transistor's gate terminal and configured to control the time when the fourteenth transistor conducts;

a fifteenth transistor, its first terminal being electrically connected to the first integrated circuit, its second terminal being electrically connected to the pulse amplitude modulation voltage feed-in end; and a second multiplexer, electrically connected to the fifteenth transistor's gate terminal and configured to control the time when the fifteenth transistor conducts.

12. The driving circuit of claim 6, further comprising:

a sixteenth transistor, its first terminal being electrically connected to a second integrated circuit, its second terminal being electrically connected to the pulse width modulation voltage feed-in end;

a seventeenth transistor, its first terminal being electrically connected to a third integrated circuit, its second terminal being electrically connected to the pulse amplitude modulation voltage feed-in end; and a third multiplexer, electrically connected to the gate terminals of the sixteenth transistor and the seventeenth transistor, and configured to control the time when the sixteenth transistor and the seventeenth transistor conduct.

13. The driving circuit of claim 6, further comprising:

an eighteenth transistor, its first terminal being electrically connected to a fourth integrated circuit, its second terminal being electrically connected to the pulse width modulation voltage feed-in end;

a nineteenth transistor, its first terminal being electrically connected to the fourth integrated circuit, its second terminal being electrically connected to the pulse amplitude modulation voltage feed-in end; and a fourth multiplexer, electrically connected to the gate terminals of the eighteenth transistor and the nineteenth transistor, and configured to control the time when the eighteenth transistor and the nineteenth transistor conduct, wherein the gate terminals of the ninth transistor and the twelfth transistor are configured to receive a fourth control signal, and the gate terminals of the seventh transistor and the eleventh transistor are configured to receive a fifth control signal.

14. The driving circuit of claim 6, wherein the light emitting control circuit further comprises:

a twentieth transistor, its first terminal being electrically connected to the first transistor's second terminal and the second transistor's second terminal, its gate terminal being electrically connected to the third transistor's second terminal and the fourth transistor's second terminal, a twenty-first transistor, its first terminal being electrically connected to the twentieth transistor's gate terminal, its gate terminal being configured to receive a reset signal, its second terminal being electrically connected to a third system voltage terminal, a twenty-second transistor, its first terminal being electrically connected to the twenty-first transistor's first terminal, its gate terminal being configured to receive a setting signal, its second terminal being electrically connected to the third system voltage terminal, a fourth capacitor, its first terminal being electrically connected to the twenty-second transistor's first terminal, its second terminal being electrically connected to the twenty-second transistor's second terminal, and a twenty-third transistor, its first terminal being electrically connected to the twentieth transistor's second terminal, its gate terminal being configured to receive the reset signal, its second terminal being electrically connected to the fourth capacitor's second terminal.

15. A driving method configured to drive a pixel circuit, comprising:

in a first mode, adjusting a voltage of a pulse width modulation voltage feed-in end of the pixel circuit and fixing a voltage of a pulse amplitude modulation voltage feed-in end of the pixel circuit; and in a second mode, fixing the voltage of the pulse width modulation voltage feed-in end, and adjusting the voltage of the pulse amplitude modulation voltage feed-in end;

wherein the voltage of the pulse width modulation voltage feed-in end controls a lasting time of a driving signal, and the voltage of the pulse amplitude modulation voltage feed-in end controls a strength of the driving signal.

16. The driving method of claim 15, wherein the first mode is used when the gray level is relatively high, and the second mode is used when the gray level is relatively low.

17. The driving method of claim 15, wherein, in the first mode, adjusting the voltage of the pulse width modulation voltage feed-in end further comprises providing a first plurality of signals to a plurality of sub-pixel circuits of the pixel circuit, the first plurality of signals having different strengths; and fixing the voltage of the pulse amplitude modulation voltage feed-in end further comprises providing a second plurality of signals to the plurality of sub-pixel circuits of the pixel circuit, the second plurality of signals having the same strengths.

18. The driving method of claim 15, wherein, in the second mode, fixing the voltage of the pulse width modulation voltage feed-in end further comprises providing a first plurality of signals to a plurality of sub-pixel circuits of the pixel circuit, the first plurality of signals having the same strengths; and adjusting the voltage of the pulse amplitude modulation voltage feed-in end further comprises providing a second plurality of signals to the plurality of sub-pixel circuits of the pixel circuit, the second plurality of signals having different strengths.

19. The driving method of claim 18, wherein the first plurality of signals and the second plurality of signals are sequentially provided to the plurality of sub-pixel circuits.

20. The driving method of claim 18, wherein the first plurality of signals and the second plurality of signals are simultaneously provided to the plurality of sub-pixel circuits.

* * * * *